US012735522B2

United States Patent
Zhang et al.

(12) United States Patent
(10) Patent No.: US 12,735,522 B2
(45) Date of Patent: *Sep. 15, 2026

(54) RESIN COMPOSITION AND ARTICLE MADE THEREFROM

(71) Applicant: ELITE ELECTRONIC MATERIAL (KUNSHAN) CO., LTD., Kunshan City (CN)

(72) Inventors: Yan Zhang, Kunshan City (CN); Tianyu Cai, Kunshan City (CN); Diya Liu, Kunshan City (CN)

(73) Assignee: ELITE ELECTRONIC MATERIAL (KUNSHAN) CO., LTD., Kunshan City (CN)

( * ) Notice: Subject to any disclaimer, the term of this patent is extended or adjusted under 35 U.S.C. 154(b) by 571 days.

This patent is subject to a terminal disclaimer.

(21) Appl. No.: 18/221,850

(22) Filed: Jul. 13, 2023

(65) Prior Publication Data

US 2024/0384022 A1 Nov. 21, 2024

(30) Foreign Application Priority Data

May 19, 2023 (CN) ......................... 202310572820.7

(51) Int. Cl.

*C08F 261/02* (2006.01)
*C08J 5/24* (2006.01)
*C08L 51/08* (2006.01)
*H05K 1/03* (2006.01)

(52) U.S. Cl.

CPC ............. *C08F 261/02* (2013.01); *C08J 5/244* (2021.05); *C08L 51/08* (2013.01); *H05K 1/0326* (2013.01); *C08J 2351/08* (2013.01); *C08J 2471/12* (2013.01); *C08L 2205/025* (2013.01); *C08L 2205/03* (2013.01)

(58) Field of Classification Search

CPC ..... C08F 261/02; C08F 290/062; C08J 5/244; C08J 2351/08; C08J 2471/12; C08J 5/249; C08L 51/08; C08L 2205/025; C08L 2205/03; C08L 71/126; C08L 2203/20; H05K 1/0326; C08K 5/5397; C08K 5/5333; C08K 2201/014

See application file for complete search history.

(56) References Cited

U.S. PATENT DOCUMENTS

2004/0025743 A1* 2/2004 Wakizaka ................ C09D 5/18 106/18.11
2004/0082730 A1* 4/2004 Japp ...................... C08L 71/126 525/391
2019/0169213 A1* 6/2019 Kobilka .................. C07F 9/113

OTHER PUBLICATIONS

Levchenko, "Photocurable and Thermosetting Polymer Materials on the Basis of Benzocyclobutene and its Derivatives for Electronics," 2018, vol. 88, No. 12, pp. 2793-2812. (Year: 2018).*

* cited by examiner

*Primary Examiner* — Robert S Jones, Jr.
*Assistant Examiner* — Joshua Caleb Bledsoe
(74) *Attorney, Agent, or Firm* — Maschoff Brennan

(57) ABSTRACT

The present disclosure provides a resin composition and an article made therefrom, and the article comprises a prepreg, a resin film, a laminate, or a printed circuit board. The resin composition comprises (A) 100 parts by weight of an unsaturated C=C double bond-containing polyphenylene ether resin and (B) 20 parts by weight to 60 parts by weight of a phosphorus-containing compound represented by Formula (1). The article has an improvement in at least one or more or all of the glass transition temperature, the dielectric constant, the dissipation factor, the flame retardancy, the percent thermal expansion at Z-axis, the water absorption rate, the interlayer bonding strength, and alkali resistance.

Formula (1)

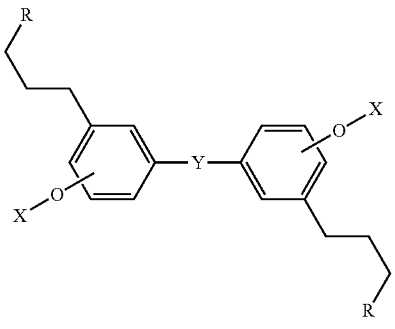

9 Claims, 1 Drawing Sheet

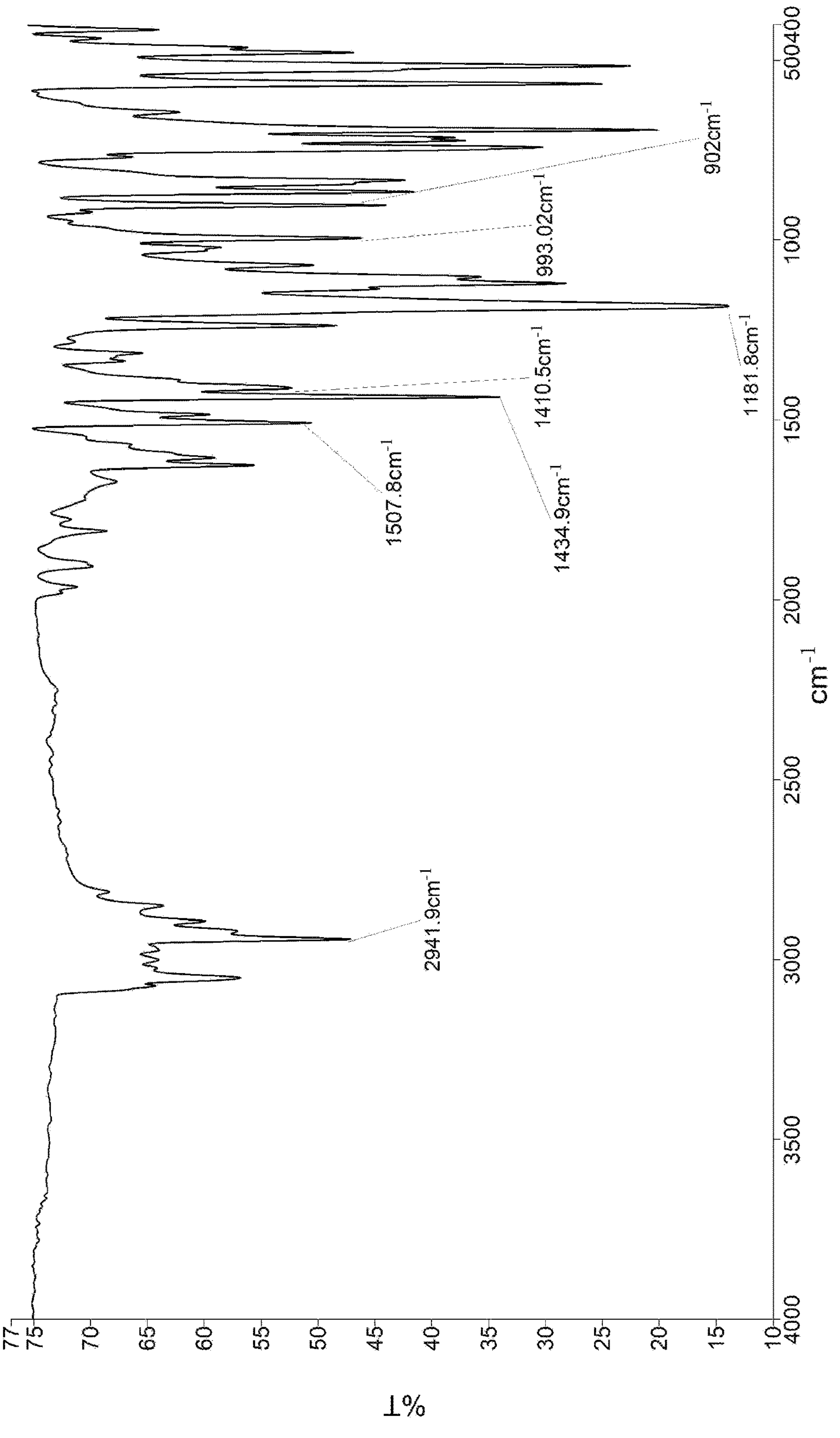
%T
cm-1
2941.9cm-1
1507.8cm-1
1434.9cm-1
1410.5cm-1
1181.8cm-1
993.02cm-1
902cm-1
77
75
70
65
60
55
50
45
40
35
30
25
20
15
10
4000
3500
3000
2500
2000
1500
1000
500
400

RESIN COMPOSITION AND ARTICLE MADE THEREFROM

CROSS-REFERENCE TO RELATED APPLICATIONS

This non-provisional application claims priority under 35 U. S. C. § 119(a) on Patent Application No. 202310572820.7 filed in China on May 19, 2023, the entire contents of which are hereby incorporated by reference.

BACKGROUND

1. Technical Field

This present disclosure relates to a resin composition and an article made therefrom, particularly to a resin composition which can be applied to a prepreg, a resin film, a laminate, and a printed circuit board.

2. Related Art

Recently, with the continuous upgrade of electronic products, such as smartphones, new energy vehicles, servers or the like, the printed circuit boards used therein have been also continuously developed toward multiple-layer construction, high-density interconnection and high-frequency and high-speed signal transmission. The market demands for copper-clad laminate which serves as a base material having a crucial impact on the performance of printed circuit board increases day by day. On the other hand, in order to comply with the global trend of environmental protection and green regulations, halogen-free materials have become mainstream in the current electronic industry.

In the prior art, polyphenylene ether resin has become one of the main raw materials for the production of copper-clad laminate due to its good low dielectric property. Meanwhile, in order to meet the requirement of flame retardancy and green environmental protection, a phosphorus-containing flame retardant is usually added thereto. However, the ordinary phosphorus-containing flame retardant has no reactive functional groups and has a poor dielectric property, resulting in poor compatibility with the polyphenylene ether resin. The dielectric constant and dissipation factor of the produced copper-clad laminate rise so that the produced copper-clad laminate cannot be applied to various conditions, such as high temperature or high humidity environment or the like. The produced copper-clad laminate easily results in the malfunction of the electronic components of the circuit board due to its high moisture absorption, poor interlayer bonding strength, low glass transition temperature, high percent thermal expansion, poor alkali resistance or the like. Therefore, it is imperative to develop a material for copper-clad laminates with low dielectric constant and low dissipation factor, high flame retardancy, low moisture absorption, high interlayer bonding strength, high glass transition temperature, low percent thermal expansion and excellent alkali resistance.

SUMMARY

The present disclosure provides a resin composition and an article made therefrom, such as a prepreg, a resin film, a laminate and a printed circuit board, which is able to solve the problems described above.

The resin composition of the present disclosure comprises:

(A) 100 parts by weight of an unsaturated C═C double bond-containing polyphenylene ether resin; and (B) 20 parts by weight to 60 parts by weight of a phosphorus-containing compound represented by Formula (1);

Formula (1)

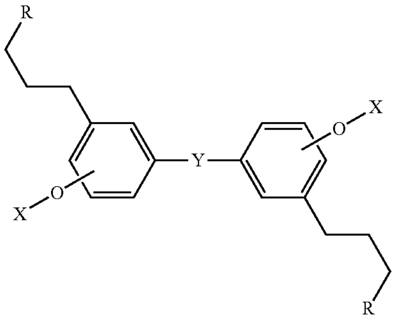

wherein in Formula (1), each of X is independently a group represented by Formula (2), Formula (3) or Formula (4), Y is a covalent bond or a C1 to C3 alkyl group, and each of R is independently a group represented by Formula (5) or Formula (6), Formula (2)

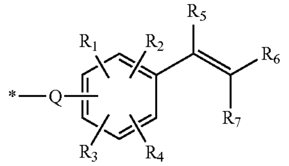

Formula (3)

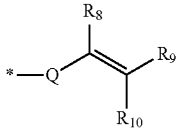

Formula (4)

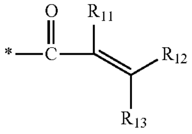

Formula (5)

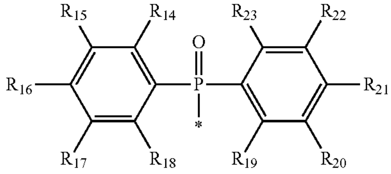

Formula (6)

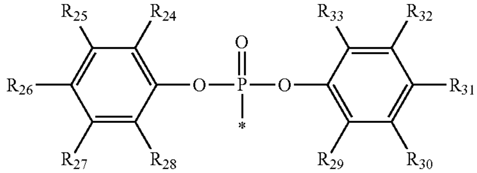

wherein each of $R_1$ to $R_{33}$ is independently a hydrogen atom or a C1 to C3 alkyl group, and each of Q is independently a covalent bond or a $C_1$ to $C_3$ alkyl group.

Preferably, in Formula (1), each of X is independently a vinyl group, a vinylbenzyl group, an allyl group, or a (meth)acryloyl group.

Preferably, the phosphorus-containing compound represented by Formula (1) comprises any one of phosphorus-containing compounds represented by Formula (7) to Formula (14), or a combination thereof,
Formula (7)
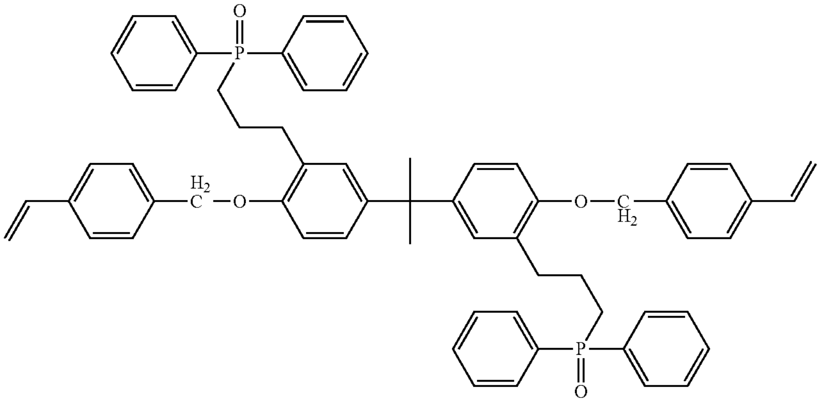
Formula (8)
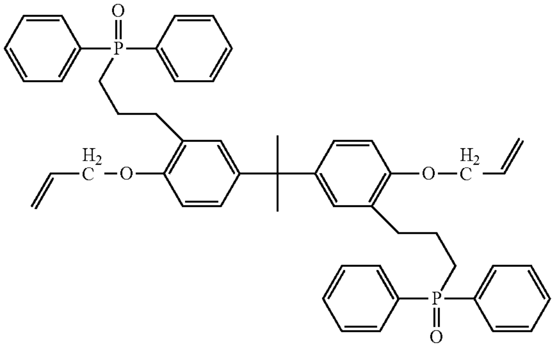
Formula (9)
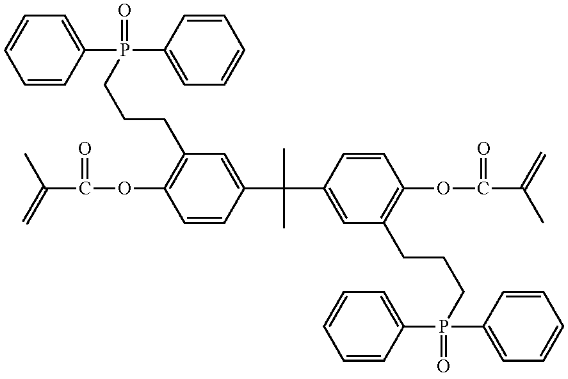
Formula (10)
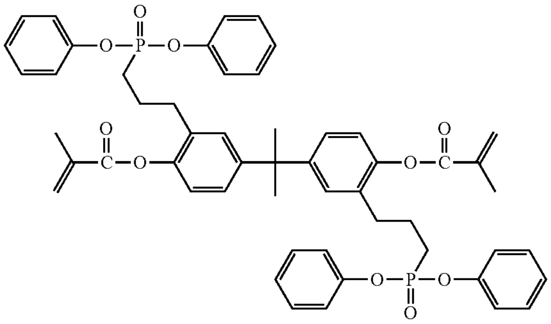
Formula (11)
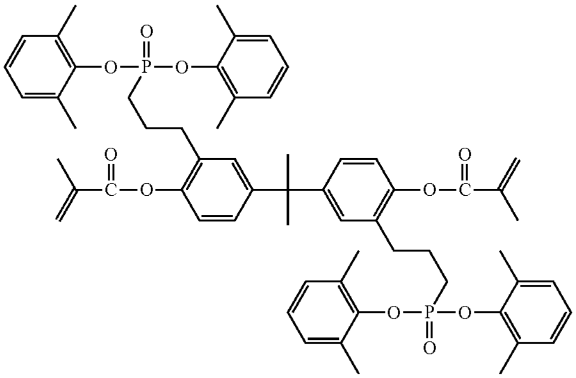

-continued

Formula (12)

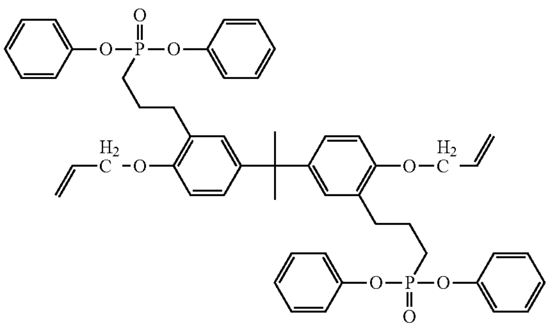

Formula (13)

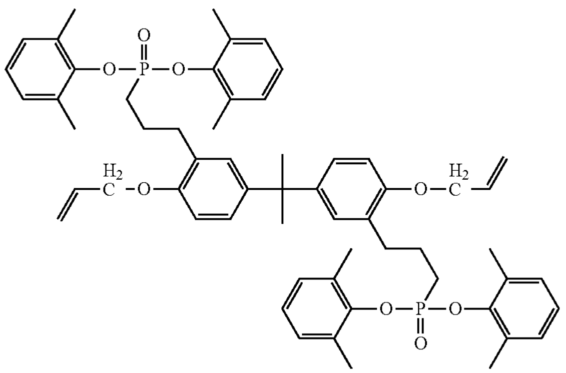

Formula (14)

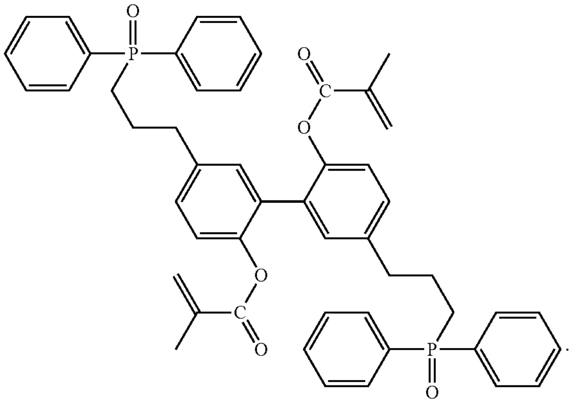

Preferably, the unsaturated C═C double bond-containing polyphenylene ether resin comprises any one of a (meth) acryloyl-containing polyphenylene ether resin, a vinylbenzyl-containing polyphenylene ether resin, and a vinyl-containing polyphenylene ether resin, a combination thereof.

Preferably, the resin composition further comprises any one of a polyolefin, an organic silicone resin, a benzoxazine resin, an epoxy resin, a polyester resin, a phenol resin, an amine curing agent, a polyamide, a polyimide, a styrene maleic anhydride, a maleimide resin, a cyanate ester resin, and a maleimide triazine resin, or a combination thereof.

Preferably, the resin composition further comprises an unsaturated C═C double bond-containing crosslinking agent, the unsaturated C═C double bond-containing crosslinking agent is any one of bis(vinylphenyl)ethane, bis (vinylbenzyl) ether, divinylbenzene, divinylnaphthalene, divinylbiphenyl, tert-butyl styrene, triallyl isocyanurate, triallyl cyanurate, trivinylcyclochexane, diallyl bisphenol A, styrene, butadiene, decadiene, octadiene, vinyl carbazole, and acrylate ester, or a combination thereof, and the unsaturated C═C double bond-containing crosslinking agent is 1 part by weight to 30 parts by weight with respect to 100 parts by weight of the unsaturated C═C double bond-containing polyphenylene ether resin.

The resin composition further comprises any one of a curing accelerator, a polymerization inhibitor, an inorganic filler, a surfactant, a coloring agent, and a solvent, or a combination thereof.

The present disclosure further provides an article made from the resin composition described above, the article comprises a prepreg, a resin film, a laminate, or a printed circuit board.

Preferably, the article having at least one of the following properties:

- a glass transition temperature as measured by reference to IPC-TM-650 2.4.24.4 of greater than or equal to 210° C.;
- a dielectric constant at 10 GHz as measured by reference to JISC2565 of less than or equal to 3.24;
- a dissipation factor at 10 GHz as measured by reference to JISC2565 of less than or equal to 0.0025;
- a flame retardancy as measured by reference to UL94 rating of V0;
- a percent thermal expansion at Z-axis as measured by reference to IPC-TM-650 2.4.24.5 of less than or equal to 2.0%;
- a water absorption rate as measured by reference to IPC-TM-650 2.6.2.1 and IPC-TM-650 2.6.16.1 of less than or equal to 0.34%;
- an interlayer bonding strength as measured by reference to IPC-TM-650 2.4.8 of greater than or equal to 3.0 lb/in.

BRIEF DESCRIPTION OF THE DRAWINGS

The present disclosure will become better understood from the detailed description given hereinbelow and the accompanying drawings which are given by way of illustration only and thus are not intended to limit the present disclosure and wherein:

FIG. 1 illustrates an FTIR spectrum of P1 as an example of the phosphorus-containing compound in one exemplary embodiment of the present disclosure.

DETAILED DESCRIPTION

All technical and scientific terms used herein have the common meaning as understood by those skilled in the art. Unless otherwise set forth in the specification, the terms defined herein shall prevail.

The terms "comprise," "include," "contain," "have," or the like belongs to open-ended transitional phrase (i.e., other elements not listed herein may be contained). The terms "consisting of," "composed by," "remainder being," or the like belongs to close-ended transitional phrases.

For the convenience of the description, numerical ranges used herein shall be understood as including all of the possible subranges and individual numerals or values therein, including integers and fractions.

The value used herein includes all of the values which will be the same as such value after being rounded off.

It should be understood that members in the Markush group can individually or combinely be used to describe the present disclosure.

A polymer used herein refers to the product formed by monomer(s) via polymerization. A polymer may include a homopolymer (also known as a self-polymer), a copolymer, a prepolymer, etc., but the present disclosure is not limited thereto. A homopolymer refers to the polymer formed by the polymerization of one monomer. Copolymers comprise: random copolymers, such as a structure of -AABABB-BAAABBA-; alternating copolymers, such as a structure of -ABABABAB-; graft copolymers, such as a structure of -AA(A-BBBB)AA(A-BBBB)AAA-; and block copolymers, such as a structure of -AAAAA-BBBBBB-AAAAA-. For instance, a styrene-butadiene copolymer disclosed herein comprises a styrene-butadiene random copolymer, a styrene-butadiene alternating copolymer, a styrene-butadiene graft copolymer, a styrene-butadiene block copolymer or a combination thereof. A prepolymer refers to a polymer having a lower molecular weight between the molecular weight of monomer and the molecular weight of final polymer, and a prepolymer contains a reactive functional group capable of participating further polymerization to obtain the final polymer product which has been fully crosslinked or cured. The term "polymer" includes an oligomer, but the present disclosure is not limited thereto. An oligomer, also known as low polymer, refers to a polymer with 2 to 20, typically 2 to 5, repeating units.

The term "resin" used herein includes monomer, polymer thereof, a combination of the monomer, a combination of the polymer, or a combination of the monomer and the polymer, but the present disclosure is not limited thereto.

A modification described herein includes a modification includes a product derived from a resin with its reactive functional group modified, a product derived from a prepolymerization reaction of each resin and other resins, a product derived from copolymerizing each resin and other resins, a product derived from crosslinking reaction of each resin and other resins or the like.

The unsaturated bonds used herein refer to reactive unsaturated bonds (e.g., unsaturated bonds capable of carrying out crosslinking reaction with other functional groups), but the present disclosure is not limited thereto.

The unsaturated C═C double bond used herein, preferably, includes a vinyl group, a vinylbenzyl group, a (meth) acryloyl group, an allyl group or a combination thereof, but the present disclosure is not limited thereto. The term "vinyl group" includes a vinyl group and a vinylidene group. The term "(meth)acryloyl group" includes an acryloyl group and a methylacryloyl group.

Alkyl group, alkenyl group, monomer used herein includes any isomers thereof. For instance, propyl group includes n-propyl group and isopropyl group.

The term "parts by weight" used herein represents the relative parts by weight in the composition, which may be any weight unit, such as kilogram, gram, pound or the like, but the present disclosure is not limited thereto. For instance, 100 parts by weight of an unsaturated C═C double bond-containing polyphenylene ether resin may represent 100 kilograms of the unsaturated C═C double bond-containing polyphenylene ether resin or 100 pounds of the unsaturated C═C double bond-containing polyphenylene ether resin.

It should be understood that as long as there is no contradiction, each of the features of the exemplary embodiments described herein may be individually or combinely combined with each other.

It should be understood that the exemplary embodiments described herein are exemplary in all aspects and are not intended to limit the scope of the present disclosure. Therefore, the scope of the present disclosure is not limited to the exemplary embodiments.

The present disclosure discloses a resin composition, comprising:

(A) 100 parts by weight of an unsaturated C═C double bond-containing polyphenylene ether resin; and (B) 20 parts by weight to 60 parts by weight of a phosphorus-containing compound represented by Formula (1);

Formula (1)

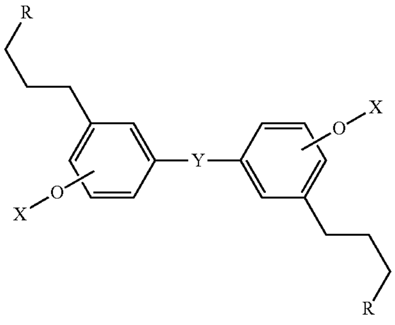

wherein in Formula (1), each of X is independently a group represented by Formula (2), Formula (3) or Formula (4), Y is a covalent bond or a C1 to C3 alkyl group, and each of R is independently a group represented by Formula (5) or Formula (6), Formula (2)

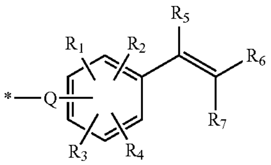

Formula (3)

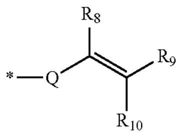

-continued

Formula (4)

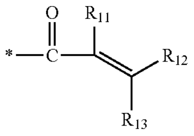

Formula (5)

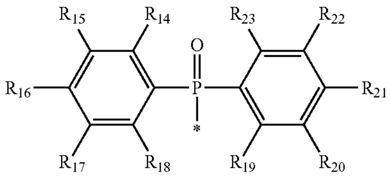

-continued

Formula (6)

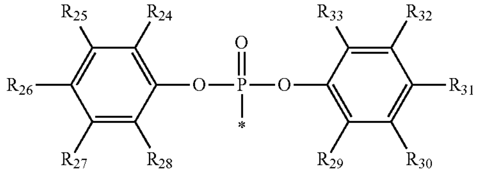

wherein each of $R_1$ to $R_{33}$ is independently a hydrogen atom or a $C_1$ to $C_3$ alkyl group, such as methyl group, ethyl group or propyl group, and each of Q is independently a covalent bond or a $C_1$ to $C_3$ alkyl group, such as methyl group, ethyl group or propyl group.

In Formula (1), each of X is preferably independently a vinyl group, a vinylbenzyl group, an allyl group, or a (meth)acryloyl group.

In one exemplary embodiment, for instance, the phosphorus-containing compound represented by Formula (1) comprises any one of phosphorus-containing compounds represented by Formula (7) to Formula (14), or a combination thereof, Formula (7)

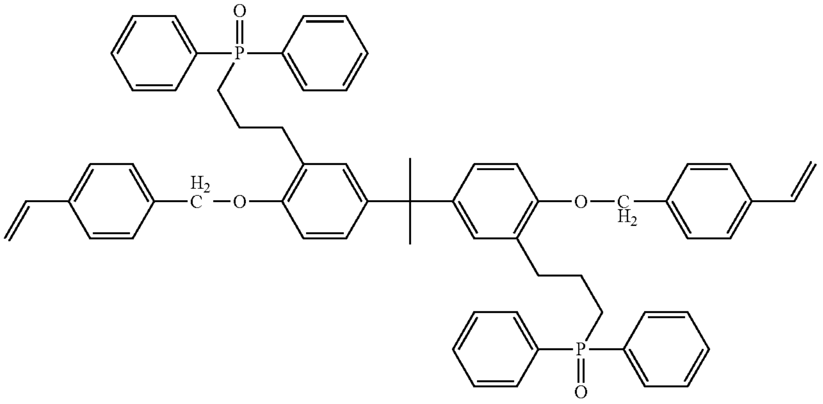

Formula (8)

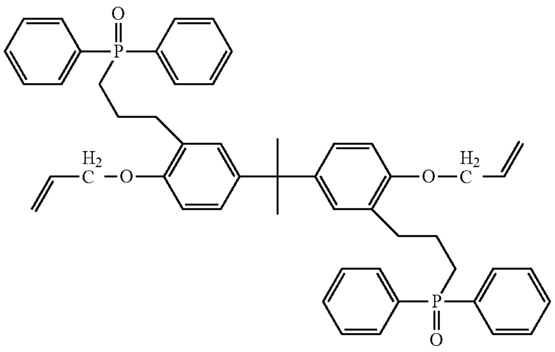

Formula (9)

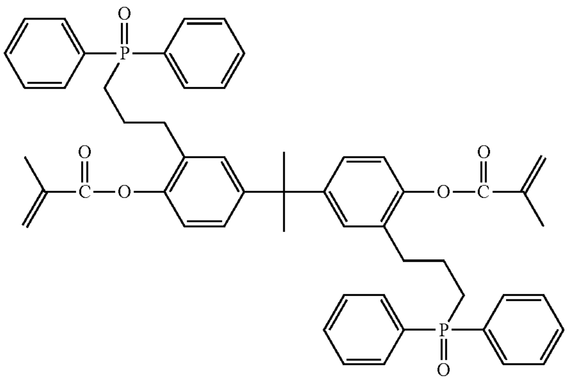

-continued

Formula (10)

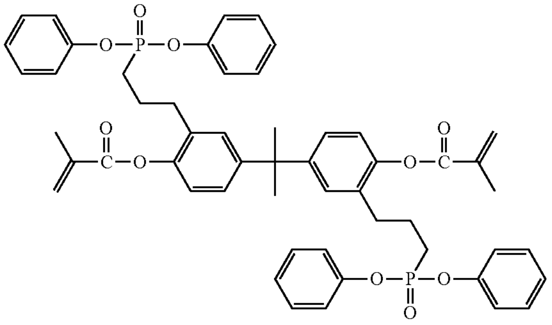

Formula (11)

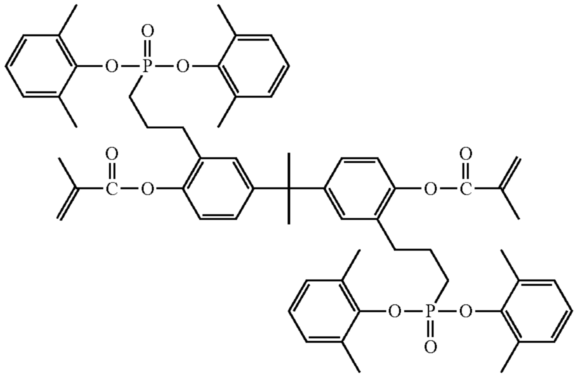

Formula (12)

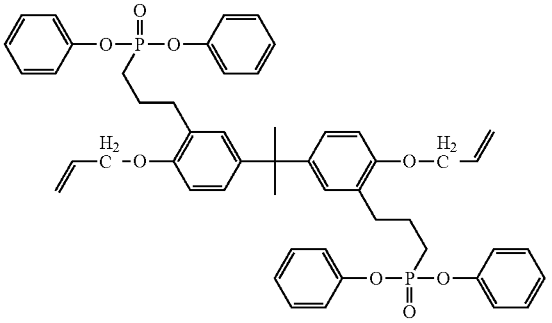

Formula (13)

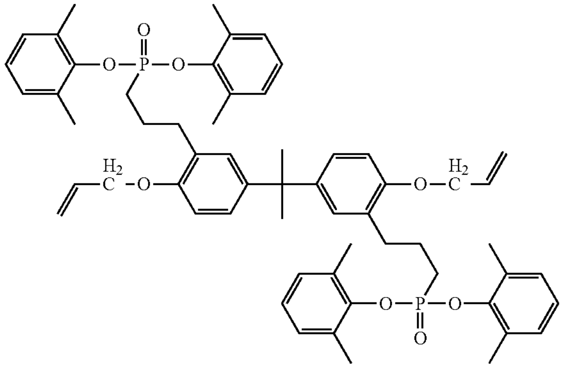

Formula (14)

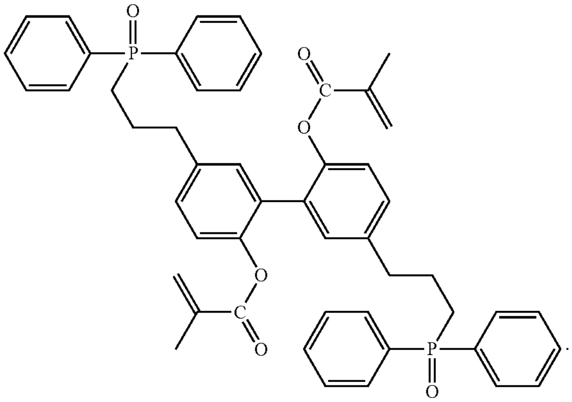

In the resin composition of the present disclosure, the amount of each component is based on the total amount of the unsaturated C═C double bond-containing polyphenylene ether resin as 100 parts by weight, for instance, the amount of the phosphorus-containing compound represented by Formula (1) may be 20 parts by weight to 60 parts by weight, with respect to a total of 100 parts by weight of the unsaturated C═C double bond-containing polyphenylene ether resin, but the present disclosure is not limited thereto. For instance, the total amount of the phosphorus-containing compound represented by Formula (1) may be 20, 30, 40, 50, or 60 parts by weight, with respect to a total of 100 parts by weight of the unsaturated C═C double bond-containing polyphenylene ether resin.

The phosphorus-containing compound represented by Formula (1) may be prepared by any methods known by the person ordinarily skilled in the art. For instance, the phosphorus-containing compound represented by Formula (1) may be prepared by the following method:

step (1): reacting diallyl bisphenol with one or more of compounds R-H to obtain intermediate compound 1;

step (2): reacting the intermediate compound 1 with one or more of X-X' to obtain the phosphorus-containing compound represented by Formula (1).

In step (1), an organic solvent, including toluene, xylene or a combination thereof, may be further added, but the present disclosure is not limited thereto.

In step (1), the definition of R in R—H is the same as that of R in the Formula (1), and H represents hydrogen atom. R—H includes diphenylphosphine oxide (DPO), diphenyl phosphate or bis(2,6-dimethylphenyl) phosphate, but the present disclosure is not limited thereto. The molar ratio of R—H and diallyl bisphenol is 2:1 to 3:1.

The reaction temperature in step (1) is 80° C. to 160° C.

The reaction time in step (1) is 1 to 6 hours.

In step (2), an organic solvent, including toluene, xylene or a combination thereof, may be further added, but the present disclosure is not limited thereto.

In step (2), a phase transfer agent, including tetrabutylammonium bromide, may be further added, but the present disclosure is not limited thereto.

In step (2), an inorganic base or organic base, including NaOH, potassium tert-butoxide, triethylamine or a combination thereof, may be further added, but the present disclosure is not limited thereto.

In step (2), the definition of X in X-X' is the same as that of X in Formula (1), X' represents halogen atom, preferably chlorine atom or bromine atom. X-X' includes p-chloromethyl styrene, bromopropene, methylacryloyl bromide, but the present disclosure is not limited thereto. The molar ratio of X-X' and the intermediate compound 1 is 2:1 to 3:1.

The reaction temperature in step (2) is −20° C. to 120° C.

The reaction time in step (2) is 3 to 12 hours.

The unsaturated C═C double bond-containing polyphenylene ether resin applicable to the present disclosure is not particularly limited, may be any one or more of unsaturated C═C double bond-containing polyphenylene ether resins applicable to the production of a prepreg, a resin film, a laminate, or a printed circuit board, and may be any one or more of commercial products, homemade products or a combination thereof, such as (meth)acryloyl-containing polyphenylene ether resin, vinylbenzyl-containing polyphenylene ether resin, vinyl-containing polyphenylene ether resin, or a combination thereof, but the present disclosure is not limited thereto.

All the unsaturated C═C double bond-containing polyphenylene ether resins of the present disclosure have unsaturated C═C double bonds and a backbone of phenyl ether, wherein the unsaturated C═C double bonds are reactive functional groups, which may be self-polymerized after heated and may perform free radical polymerization with other components containing an unsaturated bond in the resin composition and finally result in crosslinking and curing. The cured products have properties of high heat resistance and low dielectric. Preferably, the unsaturated C═C double bond-containing polyphenylene ether resin includes an unsaturated C═C double bond-containing polyphenylene ether resin with 2,6-dimethyl substitution in its phenylene ether backbone, wherein the methyl groups form steric hindrance to prevent the oxygen atom of the ether group from forming a hydrogen bond or Van der Waals force to absorb moisture, thereby having a lower dielectric property.

In some exemplary embodiments, the unsaturated C═C double bond-containing polyphenylene ether resin includes a (meth)acryloyl-containing polyphenylene ether resin with a number average molecular weight of about 1900 to 2300 (such as SA9000, available from Sabic), a vinylbenzyl-containing polyphenylene ether resin with a number average molecular weight of about 1200 (such as OPE-2st 1200, available from Mitsubishi Gas Chemical Co., Inc.), a vinylbenzyl-containing polyphenylene ether resin with a number average molecular weight of about 2200 (such as OPE-2st 2200, available from Mitsubishi Gas Chemical Co., Inc.), a vinylbenzyl-containing polyphenylene ether resin with a number average molecular weight of about 2400 to 2800 (such as vinylbenzyl-containing bisphenol A polyphenylene ether resin), a vinyl-containing polyphenylene ether resin with a number average molecular weight of about 2200 to 3000, or a combination thereof, but the present disclosure is not limited thereto. Among them, the vinyl-containing polyphenylene ether resin may include various polyphenylene ether resins disclosed in US Patent Application Publication No. 20160185904 A1, all of which are incorporated herein by reference in their entirety. Among them, the vinylbenzyl-containing polyphenylene ether resin includes a vinylbenzyl-containing biphenyl polyphenylene ether resin, a vinylbenzyl-containing bisphenol A polyphenylene ether resin, or a combination thereof, but the present disclosure is not limited thereto.

For instance, in one exemplary embodiment, any one of a polyolefin, an organic silicone resin, a benzoxazine resin, an epoxy resin, a polyester resin, a phenol resin, an amine curing agent, a polyamide, a polyimide, a styrene maleic anhydride, a maleimide resin, a cyanate ester resin, and a maleimide triazine resin, or a combination thereof may also be added into the resin composition of the present disclosure as needed.

For instance, in one exemplary embodiment, an unsaturated C═C double bond-containing crosslinking agent may also be added to the resin composition of the present disclosure. For instance, the unsaturated C═C double bond-containing crosslinking agent may be various unsaturated C═C double bond-containing crosslinking agents known in the field. Specific examples of the unsaturated C═C double bond-containing crosslinking agent are any one of bis(vinylphenyl)ethane, bis(vinylbenzyl) ether, divinylbenzene, divinylnaphthalene, divinylbiphenyl, tert-butylstyrene, triallyl isocyanurate, triallyl cyanurate, trivinylcyclochexane, diallyl bisphenol A, styrene, butadiene, decadiene, octadiene, vinyl carbazole, and acrylate ester, or a combination thereof.

The amount of the unsaturated C═C double bond-containing crosslinking agent in the resin composition of the present disclosure may be adjusted as needed, for instance, with respect to 100 parts by weight of the unsaturated C═C double bond-containing polyphenylene ether resin, the amount of the unsaturated C═C double bond-containing crosslinking agent may be 1 to 30 parts by weight, preferably 1 to 20 parts by weight, such as 1 part by weight, 5 parts by weight, 10 parts by weight, 15 parts by weight or 20 parts by weight, but the present disclosure is not limited thereto.

In For instance, the polyolefin resin may be various polyolefin resins known in the field. Specific examples of the polyolefin resin include polybutadiene, polyisoprene, styrene-butadiene copolymer, styrene-isoprene copolymer, styrene-butadiene-divinylbenzene terpolymer, styrene-butadiene-maleic anhydride terpolymer, vinyl-polybutadiene-urethane polymer, maleic anhydride-butadiene copolymer, polymethylstyrene, hydrogenated polybutadiene, hydrogenated polyisoprene, hydrogenated styrene-butadiene-divinylbenzene terpolymer, hydrogenated styrene-butadiene-maleic anhydride terpolymer, hydrogenated styrene-butadiene copolymer, hydrogenated styrene-isoprene copolymer, polyfunctional vinyl aromatic copolymer, or a combination thereof, but the present disclosure is not limited thereto.

The polyfunctional vinyl aromatic copolymer in the resin composition of the present disclosure may include various polyfunctional vinyl aromatic copolymers disclosed in US Patent Application Publication No. 20070129502 A1, all of which are incorporated herein by reference in their entirety.

The amount of the polyolefin resin herein may be adjusted as needed, for instance, with respect to 100 parts by weight of the unsaturated C═C double bond-containing polyphenylene ether resin, the amount of the polyolefin resin may be 10 to 100 parts by weight, such as 10 parts by weight, 15 parts by weight, 20 parts by weight, 30 parts by weight, 40 parts by weight, 50 parts by weight, 60 parts by weight, 70 parts by weight, 80 parts by weight, 90 parts by weight or 100 parts by weight, but the present disclosure is not limited thereto.

For instance, the organic silicone resin may be various organic silicone resins known in the field. Specific examples of the organic silicone resin include a polyalkylsiloxane resin, a polyarylsiloxane resin, a polyalkarylsiloxane resin, a modified polysiloxane resin, or a combination thereof, but the present disclosure is not limited thereto. Preferably, an amino-modified silicone resin is applicable to the organic silicone resin in the resin composition of the present disclosure, such as products KF-8010, X-22-161A, X-22-161B, KF-8012, KF-8008, X-22-9409, and X-22-1660B-3 available from Shin-Etsu Chemical Co., Ltd., products BY-16-853U, BY-16-853, and BY-16-853B available from Toray-Dow coming Co., Ltd., and products XF42-C5742, XF42-C6252, and XF42-C5379 available from Momentive Performance Materials JAPAN LLC, or a combination thereof, but the present disclosure is not limited thereto.

The amount of the organic silicone resin in the resin composition of the present disclosure may be adjusted as needed, for instance with respect to 100 parts by weight of the unsaturated C═C double bond-containing polyphenylene ether resin, the amount of the organic silicone resin may be 10 to 100 parts by weight, such as 10 parts by weight, 15 parts by weight, 20 parts by weight, 30 parts by weight, 40 parts by weight, 50 parts by weight, 60 parts by weight, 70 parts by weight, 80 parts by weight, 90 parts by weight or 100 parts by weight, but the present disclosure is not limited thereto.

For instance, the benzoxazine resin may be various benzoxazine resins known in the field. Specific examples of the benzoxazine resin include bisphenol A benzoxazine resin, bisphenol F benzoxazine resin, phenolphthalein benzoxazine resin, dicyclopentadiene benzoxazine resin, phosphorus-containing benzoxazine resin, diaminobenzoxazine resin, and phenyl, vinyl or allyl-modified benzoxazine resin, but the present disclosure is not limited thereto. Commercially available products include LZ-8270 (phenolphthalein benzoxazine resin), LZ-8298 (phenolphthalein benzoxazine resin), LZ-8280 (bisphenol F benzoxazine resin) and LZ-8290 (bisphenol A benzoxazine resin) available from Huntsman, or KZH-5031 (vinyl-modified benzoxazine resin) and KZH-5032 (phenyl-modified benzoxazine resin) available from Kolon Industries Inc. Among them, the diaminobenzoxazine resin may be diaminodiphenylmethane benzoxazine resin, diaminodiphenyl ether benzoxazine resin, diaminodiphenyl sulfone benzoxazine resin, diaminodiphenyl sulfide benzoxazine resin, or a combination thereof, but is not limited thereto.

The amount of the benzoxazine resin in the resin composition of the present disclosure may be adjusted as needed, for instance with respect to 100 parts by weight of the unsaturated C═C double bond-containing polyphenylene ether resin, the amount of the benzoxazine resin may be 10 to 100 parts by weight, such as 10 parts by weight, 15 parts by weight, 20 parts by weight, 30 parts by weight, 40 parts by weight, 50 parts by weight, 60 parts by weight, 70 parts by weight, 80 parts by weight, 90 parts by weight or 100 parts by weight, but the present disclosure is not limited thereto.

For instance, the epoxy resin may be various epoxy resins known in the field. In terms of improving the heat resistance of the resin composition, the epoxy resin described above includes such as bisphenol A epoxy resin, bisphenol F epoxy resin, bisphenol S epoxy resin, bisphenol AD epoxy resin, novolac epoxy resin, trifunctional epoxy resin, tetrafunctional epoxy resin, multifunctional novolac epoxy resin, dicyclopentadiene (DCPD) epoxy resin, phosphorus-containing epoxy resin, p-xylene epoxy resin, naphthalene epoxy resin (such as naphthol epoxy resin), benzofuran epoxy resin, isocyanate-modified epoxy resin, or a combination thereof, but the present disclosure is not limited thereto. Among them, the novolac epoxy resin may be phenol novolac epoxy resin, bisphenol A novolac epoxy resin, bisphenol F novolac epoxy resin, biphenyl novolac epoxy resin, phenol benzaldehyde epoxy resin, phenol aralkyl novolac epoxy resin or o-cresol novolac epoxy resin. Among them, the phosphorus-containing epoxy resin may be DOPO (9,10-dihydro-9-oxa-10-phosphaphenanthrene-10-oxide) epoxy resin, DOPO-HQ epoxy resin, or a combination thereof. The DOPO epoxy resin may be selected from one or more of DOPO-containing phenol novolac epoxy resin, DOPO-containing o-cresol novolac epoxy resin and DOPO-containing bisphenol-A novolac epoxy resin. The DOPO-HQ epoxy resin may be selected from one or more of DOPO-HQ-containing phenol novolac epoxy resin, DOPO-HQ-containing o-cresol novolac epoxy resin and DOPO-HQ-containing bisphenol-A novolac epoxy resin, but not limited thereto.

The amount of the epoxy resin in the resin composition of the present disclosure may be adjusted as needed, for instance with respect to 100 parts by weight of the unsaturated C═C double bond-containing polyphenylene ether resin, the amount of the epoxy resin may be 10 to 100 parts by weight, such as 10 parts by weight, 15 parts by weight, 20 parts by weight, 30 parts by weight, 40 parts by weight, 50 parts by weight, 60 parts by weight, 70 parts by weight, 80 parts by weight, 90 parts by weight or 100 parts by weight, but the present disclosure is not limited thereto.

For instance, the polyester resin may be various polyester resins known in the field. Specific examples of the polyester resin include dicyclopentadiene-containing polyester resin, biphenyl-containing polyester resin and naphthalene-containing polyester resin, but the present disclosure is not limited thereto. Specific examples of the polyester resin include HPC-8000 or HPC-8150 available from D.I.C. Corporation, but the present disclosure is not limited thereto. The amount of the polyester resin in the resin composition of the present disclosure may be adjusted as needed, such as with respect to 100 parts by weight of the unsaturated C═C double bond-containing polyphenylene ether resin, the amount of the polyester resin may be 10 to 80 parts by weight, such as 10 parts by weight, 15 parts by weight, 20 parts by weight, 30 parts by weight, 40 parts by weight, 50 parts by weight, 60 parts by weight, 70 parts by weight or 80 parts by weight, but the present disclosure is not limited thereto.

For instance, the phenol resin may be various phenol resin known in the field. Specific examples of the phenol resin include novolac resin or phenoxy resin, but the present disclosure is not limited thereto. Among them, the novolac resin includes phenol novolac resin, o-cresol novolac resin, bisphenol-A novolac resin, naphthol novolac resin, biphenyl novolac resin and dicyclopentadiene phenol resin, but not limited thereto. The amount of the phenol resin in the resin composition of the present disclosure may be adjusted as needed, such as with respect to 100 parts by weight of the unsaturated C═C double bond-containing polyphenylene ether resin, the amount of the phenol resin may be 10 to 80 parts by weight, such as 10 parts by weight, 15 parts by weight, 20 parts by weight, 30 parts by weight, 40 parts by weight, 50 parts by weight, 60 parts by weight, 70 parts by weight or 80 parts by weight, but the present disclosure is not limited thereto.

For instance, the amine curing agent may be various amine curing agents known in the field. Specific examples of the amine curing agent include at least one of diaminodiphenyl sulfone, diaminodiphenyl methane, diaminodiphenyl ether, diaminodiphenyl sulfide and dicyandiamide, or a combination thereof, but the present disclosure is not limited thereto. The amount of the amine curing agent the resin composition of the present disclosure may be adjusted as needed, such as with respect to 100 parts by weight of the unsaturated C═C double bond-containing polyphenylene ether resin, the amount of the amine curing agent may be 1 to 15 parts by weight, such as 1 part by weight, 4 parts by weight, 7.5 parts by weight, 12 parts by weight, or 15 parts by weight, but the present disclosure is not limited thereto.

For instance, the polyamide may be various polyamides known in the field, including various commercially available polyamide resin products, but the present disclosure is not limited thereto.

For instance, the polyimide may be various polyimides known in the field, including various commercially available polyimide resin products, but the present disclosure is not limited thereto.

For instance, the styrene maleic anhydride may be various styrene maleic anhydrides known in the field, wherein the ratio of the styrene (S) and maleic anhydride (MA) may be 1/1, 2/1, 3/1, 4/1, 6/1, 8/1 or 12/1. Specific examples of the styrene maleic anhydride include styrene maleic anhydride copolymers, such as SMA-1000, SMA-2000, SMA-3000, EF-30, EF-40, EF-60 and EF-80 available from Cray Valley, or styrene maleic anhydride copolymer, such as C400, C500, C700, and C900 available from Polyscope, but not limited thereto.

For instance, the maleimide resin may be various maleimide resins known in the field. Specific examples of the maleimide resin include 4,4'-diphenylmethane bismaleimide, polyphenylmethane maleimide (also known as oligomer of phenylmethane maleimide), bisphenol A diphenyl ether bismaleimide, 3,3'-dimethyl-5,5'-diethyl-4,4'-diphenylmethane bismaleimide, 3,3'-dimethyl-5,5'-dipropyl-4,4'-diphenylmethane bismaleimide, m-phenylene bismaleimide, 4-methyl-1,3-phenylene bismaleimide, 1,6-bismaleimide-(2,2,4-trimethyl)hexane, N-2,3-xylylmaleimide, N-2,6-xylylmaleimide, N-phenylmaleimide, vinylbenzyl maleimide (VBM), biphenyl-containing maleimide, maleimide resin containing an aliphatic structure with 10 to 50 carbon atoms, or a combination thereof, but the present disclosure is not limited thereto. The maleimide resin includes the modification of these components. The modification includes a prepolymer of diallyl compound and maleimide resin, a prepolymer of diamine and maleimide resin, a prepolymer of multi-functional amine and maleimide resin, a prepolymer of acidic phenol compound and maleimide resin, or a combination thereof, but the present disclosure is not limited thereto.

For instance, the maleimide resin may include products such as BMI-1000, BMI-1000H, BMI-1100, BMI-1100H, BMI-2000, BMI-2300, BMI-3000, BMI-3000H, BMI-4000, BMI-5000, BMI-5100, BMI-TMH, BMI-7000 and BMI-7000H available from Daiwakasei Industry Co., Ltd., BMI-70, and BMI-80 available from K.I Chemical Industry Co., Ltd., or MIR-3000 and MIR-5000 available from Nippon Kayaku, but the present disclosure is not limited thereto.

For instance, the maleimide resin containing the aliphatic structure with 10 to 50 carbon atoms (also known as imide-extended maleimide resin) may include various imide-extended maleimide resins disclosed in TW Patent Application Publication No. 200508284A, all of which are incorporated herein by reference in their entirety. The maleimide resin containing an aliphatic long chain structure applicable to the present disclosure may include products such as BMI-689, BMI-1400, BMI-1500, BMI-1700, BMI-2500, BMI-3000, BMI-5000 and BMI-6000 available from Designer Molecules Inc., but the present disclosure is not limited thereto For instance, the cyanate ester resin may be various cyanate ester resins known in the field. For instance, the cyanate ester resin may be a compound having Ar—O—C≡N structure, wherein Ar may be a substituted or unsubstituted aromatic group. In terms of improving the heat resistance of the resin composition, the specific example of the cyanate ester resin includes novolac cyanate ester resin, bisphenol A cyanate ester resin, bisphenol F cyanate ester resin, dicyclopentadiene-containing cyanate ester resin, naphthalene-containing cyanate ester resin, phenolphthalein cyanate ester resin, adamantane cyanate ester resin, fluorene cyanate ester resin, or a combination thereof, but the present disclosure is not limited thereto. Among them, the novolac cyanate ester resin may be bisphenol A novolac cyanate ester resin, bisphenol F novolac cyanate ester resin or a combination thereof. For instance, the cyanate ester resin may be products such as Primaset PT-15, PT-30S, PT-60S, BA-200, BA-230S, BA-3000S, BTP-2500, BTP-6020S, DT-4000, DT-7000, ULL950S, HTL-300, CE-320, LVT-50, and LeCy available from Lonza.

For instance, the maleimide triazine resin in the resin composition of the present is not particularly limited and may be any one or more of the maleimide triazine resin applicable to the production of a prepreg, a resin film, a laminate, or a printed circuit board. For instance, the maleimide triazine resin may be obtained by polymerizing the cyanate ester resin and the maleimide resin. The maleimide triazine resin may be obtained by polymerizing bisphenol A cyanate ester resin and maleimide resin, by polymerizing bisphenol F cyanate ester resin and maleimide resin, by polymerizing phenol novolac cyanate ester resin and maleimide resin, or by polymerizing dicyclopentadiene-containing cyanate ester resin and maleimide resin, but the present disclosure is not limited thereto. For instance, the maleimide triazine resin may be obtained by polymerizing cyanate ester resin and maleimide resin at any molar ratio. For instance, the cyanate ester resin may be 1 to 10 moles, with respect to 1 mole of the maleimide resin. For instance, the cyanate ester resin is 1, 2, 4 or 6 moles, with respect to 1 mole of the maleimide resin, but the present disclosure is not limited thereto.

Besides the components, the resin composition of the present disclosure may also further include any one of a curing accelerator, a polymerization inhibitor, an inorganic filler, a surfactant, a coloring agent, and a solvent, or a combination thereof, as needed.

For instance, the curing accelerator described above may include a catalyst, such as a Lewis base or a Lewis acid. The Lewis base may include one or more of imidazole, boron trifluoride-amine complex, ethyltriphenyl phosphonium chloride, 2-methylimidazole (2MI), 2-phenyl-1H-imidazole (2PZ), 2-ethyl-4-methylimidazole (2E4MI), triphenylphosphine (TPP) and 4-dimethylaminopyridine (DMAP). The Lewis acid may include metal salt compounds, such as metal salt compounds of manganese, iron, cobalt, nickel, copper and zinc, and metal catalysts, such as zinc octanoate or cobalt octanoate. The curing accelerator described above also includes a curing initiator, such as a peroxide capable of producing free radicals, including dicumyl peroxide, t-butyl peroxybenzoate, dibenzoyl peroxide (BPO), 2,5-dimethyl-2,5-di(t-butylperoxy)-3-hexyne (25B), bis(t-butylperoxyisopropyl)benzene, or a combination thereof, but the present disclosure is not limited thereto. For instance, in one exemplary embodiment, with respect to 100 parts by weight of the unsaturated C═C double bond-containing polyphenylene ether resin, the resin composition of the present disclosure may also further include 0.01 parts by weight to 5.0 parts by weight of the curing accelerator, preferably 0.01 parts by weight to 4.0 parts by weight of the curing accelerator, more preferably 0.1 parts by weight to 3.0 parts by weight of the curing accelerator, but not limited thereto.

For instance, the polymerization inhibitor described above may include 1,1-diphenyl-2-picrylhydrazyl, methyl acrylonitrile, 2,2,6,6-tetramethylpiperidine-1-oxyl, dithioester, nitroxide-mediated radical, triphenylmethyl radical, metal ion radical, sulfur radical, hydroquinone, 4-methoxyphenol, p-benzoquinone, phenothiazine, β-phenylnaphthylamine, 4-t-butylcatechol, methylene blue, 4,4'-butylidenebis(6-t-butyl-3-methylphenol), 2,2'-methylenebis(4-ethyl-6-t-butyl phenol), or a combination thereof, but the present disclosure is not limited thereto. For instance, the nitroxide-mediated radical described above may include nitroxide radicals derived from cyclic hydroxylamines such as 2,2,6,6-substituted piperidine-1-oxyl free radical or 2,2,5,5-substituted pyrrolidine-1-oxyl free radical or the like, but the present disclosure is not limited thereto. Substitutes preferably include alkyl groups with 4 or fewer carbon atoms, such as methyl group or ethyl group. The specific nitroxide radical compound is not limited, and examples include 2,2,6,6-tetramethylpiperidine-1-oxyl free radical, 2,2,6,6-tetraethylpiperidine-1-oxyl free radical, 2,2,6,6-tetramethyl-4-oxo-piperidine-1-oxyl free radical, 2,2,5,5-tetramethylpyrrolidine-1-oxyl free radical, 1,1,3,3-tetramethyl-2-isoindoline oxygen radical, N,N-di-tert-butylamine oxygen free radical or the like, but the present disclosure is not limited thereto. The nitroxide radicals may also be replaced by stable radicals such as galvinoxyl radicals. The polymerization inhibitor applicable to the resin composition of the present disclosure may also be products derived from the polymerization inhibitor with its hydrogen atom or atomic group substituted by other atom or atomic group, such as products derived from the polymerization inhibitor with its hydrogen atom substituted by an amino group, a hydroxyl group, a carbonyl group or the like. For instance, in one exemplary embodiment, with respect to 100 parts by weight of the unsaturated C═C double bond-containing polyphenylene ether resin, the resin composition of the present disclosure may also further include 0.001 parts by weight to 20 parts by weight of the polymerization inhibitor, preferably 0.01 parts by weight to 10 parts by weight of the polymerization inhibitor, but not limited thereto.

For instance, the inorganic filler described above may be any one or more of the inorganic fillers applicable to the production of a prepreg, a resin film, a laminate, or a printed circuit board. Specific examples of the inorganic filler include silica (fused, non-fused, porous or hollow type), aluminum oxide, aluminum hydroxide, magnesium oxide, magnesium hydroxide, calcium carbonate, aluminum nitride, boron nitride, aluminum silicon carbide, silicon carbide, titanium dioxide, barium titanate, lead titanate, strontium titanate, calcium titanate, magnesium titanate, barium zirconate, lead zirconate, magnesium zirconate, lead zirconate titanate, zinc molybdate, calcium molybdate, magnesium molybdate, ammonium molybdate, zinc molybdate-modified talc, zinc oxide, zirconium oxide, mica, boehmite (AlOOH), calcined talc, talc, silicon nitride, zirconium tungstate, petalite, calcined kaolin, or a combination thereof, but the present disclosure is not limited thereto. Moreover, the inorganic filler may be spherical, fibrous, plate, particulate, flake or whisker and may be optionally pretreated by a silane coupling agent. For instance, in one exemplary embodiment, the resin composition of the present disclosure may also further include 10 parts by weight to 300 parts by weight of the inorganic filler, preferably 30 parts by weight to 250 parts by weight of the inorganic filler, more preferably 60 parts by weight to 200 parts by weight of the inorganic filler, but not limited thereto, with respect to 100 parts by weight of the unsaturated C═C double bond-containing polyphenylene ether resin.

For instance, the type of the surfactant described above is not particularly limited. The purpose of the surfactant used herein is to make the inorganic filler uniformly distributed in the resin composition.

For instance, the coloring agent described above may include dye or pigment, but the present disclosure is not limited thereto.

For instance, the solvent applicable to the resin composition of the present disclosure is not particularly limited, and may be any solvent applicable to dissolving the resin composition of the present disclosure, including methanol, ethanol, ethylene glycol monomethyl ether, acetone, butanone (i.e. methyl ethyl ketone), methyl isobutyl ketone, cyclohexanone, toluene, xylene, methoxyethyl acetate, ethoxyethyl acetate, propoxyethyl acetate, ethyl acetate, dimethyl formamide, dimethyl acetamide, propylene glycol monomethyl ether acetate or a mixture thereof, but the present disclosure is not limited thereto. The additive amount of the solvent is for the purpose of adjusting the solid content of the resin composition to a suitable range. For instance, in one exemplary embodiment, the solvent is added at an additive amount to adjust the solid content of the resin composition to 50 to 85%, but not limited thereto.

The resin composition of each exemplary embodiment may be made into various articles, such as components applicable to various electronic products, including a prepreg, a resin film, a laminate, or a printed circuit board, but the present disclosure is not limited thereto.

For instance, the resin composition of each exemplary embodiment of the present disclosure may be made into a prepreg, which includes a reinforcement material and a layered structure disposed thereon. The layered structure is obtained by heating the resin composition at high temperature to a semi-cured state (B-stage). The baking temperature for making the prepreg is between 120° C. and 180° C., preferably between 120° C. and 160° C. The reinforcement material may be any one of fiber material, woven fabric, and non-woven fabric, and the woven fabric preferably includes fiberglass fabrics. Types of fiberglass fabrics are not particularly limited and may be any fiberglass fabrics for printed circuit boards, such as E-glass fiber fabric, D-glass fiber fabric, S-glass fiber fabric, T-glass fiber fabric, L-glass fiber fabric, Q-glass fiber fabric or QL-glass fiber fabric (a glass fiber fabric with a mixed structure made from Q-glass fiber fabric and L-glass fiber fabric). Types of fiberglass include yarns and rovings, in spread form or standard form. The shape of the end surface includes a circular or flat shape. The non-woven fabric preferably includes liquid crystal resin non-woven fabric, such as polyester non-woven fabric, polyurethane non-woven fabric or the like, and not limited thereto. The woven fabric may also include liquid crystal resin woven fabric, such as polyester woven fabric or polyurethane woven fabric or the like, and not limited thereto. The reinforcement materials may increase the mechanical strength of the prepreg. In one preferable exemplary embodiment, the reinforcement materials may be optionally pretreated by a silane coupling agent. The prepreg may be further heated and cured to the C-stage to form an insulation layer.

For instance, the resin composition of each exemplary embodiment of the present disclosure may be made into a resin film, which is obtained by heating and baking the resin composition to a semi-cured state. The resin composition may be optionally coated on a polyethylene terephthalate film (PET film), polyimide film (PI film), copper foil or adhesive copper foil, followed by heating and baking to a semi-cured state so as to make the resin composition form into a resin film.

For instance, the resin composition of the present disclosure may be made into various laminates, including at least two metal foils and at least one insulation layer disposed between the two metal foils. The insulation layer may be obtained by curing the resin composition at high temperature and high pressure to the C-stage. The suitable curing temperature is, for instance, between 190° C. and 220° C., preferably between 200° C. and 210° C., and the curing time is 90 to 180 minutes, preferably 120 to 150 minutes. The insulation layer may be obtained by curing the prepreg or resin film. The material of the metal foil may be copper, aluminum, nickel, platinum, silver, gold or alloy thereof, such as a copper foil. In a preferable exemplary embodiment, the laminate is a copper-clad laminate.

In one exemplary embodiment, the laminate may be further processed by circuit processing to obtain a printed circuit board.

One of the production method of the printed circuit board of the present disclosure may be as the following. A double-sided copper-clad laminate (such as product EM-827, available from Elite Material Co., Ltd.) with a thickness of 28 mil and having a 1 ounce HTE (High Temperature Elongation) copper foil may be provided and subject to drilling and electroplating so as to form electrical conduction between the top layer copper foil and the bottom layer copper foil. Then the top layer copper foil and the bottom layer copper foil are etched to form an inner layer circuit board. Then brown oxidation and roughening are performed on the inner layer circuit board to form uneven structures on the surface to increase roughness. Next, a copper foil, the prepreg, the inner layer circuit board, the prepreg, and a copper foil are sequentially stacked and then heated at 190° C. to 220° C. for 90 to 180 minutes by a vacuum lamination apparatus to cure the insulation layer material of the prepreg. Next, black oxidation, drilling, copper plating and other circuit board processes known in the field are performed on the outmost copper foil to obtain the printed circuit board.

In one or more exemplary embodiments, the resin composition of the present disclosure and various articles made therefrom may preferably having at least one of the following properties: a glass transition temperature as measured by reference to IPC-TM-650 2.4.24.4 of greater than or equal to 210° C., such as between 210° C. and 235° C.;

- a dielectric constant at 10 GHz as measured by reference to JISC2565 of less than or equal to 3.24, such as between 3.17 and 3.24;
- a dissipation factor at 10 GHz as measured by reference to JISC2565 of less than or equal to 0.0025, such as between 0.0022 and 0.0025;
- a flame retardancy as measured by reference to UL94 rating of V0;
- a percent thermal expansion at Z-axis as measured by reference to IPC-TM-650 2.4.24.5 of less than or equal to 2.0%, such as between 1.2% and 2.0%;
- a water absorption rate as measured by reference to IPC-TM-650 2.6.2.1 and IPC-TM-650 2.6.16.1 of less than or equal to 0.34%, such as between 0.25% and 0.34%;
- an interlayer bonding strength as measured by reference to IPC-TM-650 2.4.8 of greater than or equal to 3.0 lb/in, such as between 3.0 lb/in and 3.7 lb/in;
- an alkali resistance of a laminate as measured by an alkali resistance test of greater than or equal to 15 minutes, such as between 15 minutes and 25 minutes.

The property tests of the examples and comparative examples are performed by samples (specimens) prepared as described below, and are tested under specific conditions.

1. Prepreg:

The resin compositions respectively selected from the examples or comparative examples are mixed uniformly to form varnish. The varnish is loaded into an impregnation tank, and the fiberglass fabric (such as 2116 L-glass fiber fabric, 1080 L-glass fiber fabric, or 1078 L-glass fiber fabric, all available from Asahi) is then immersed into the impregnation tank described above to adhere the resin composition onto the fiberglass fabric, followed by heating at 150° C. to 170° C. to a semi-cured stage (B-Stage) to obtain a prepreg with a resin content of about 53%.

2. Copper-Clad Laminate (8-Ply, Formed by Lamination of Eight Prepregs):

Two HVLP copper foils with a thickness of 18 m and eight prepregs, with a resin content of about 53% for each, obtained from 2116 L-glass fiber fabrics impregnated with each specimen (each example or comparative example) are prepared and stacked in the order of one HVLP copper foil, eight prepregs and one HVLP copper foil, followed by lamination under vacuum at 420 psi and 200° C. for 2 hours to form a copper-clad laminate. The eight prepregs stacked with each other are cured and formed into an insulation layer between the two copper foils, and the insulation layer has a resin content of about 53%.

3. Copper-Free Laminate (8-Ply, Formed by Lamination of Eight Prepregs):

The copper-clad laminate (8-ply) described above is etched to remove two copper foils to obtain a copper-free laminate (8-ply) which is formed by laminating eight prepregs and has a resin content of about 53%.

4. Copper-Free Laminate (2-Ply, Formed by Lamination of Two Prepregs):

Two HVLP copper foils with a thickness of 18 m and two prepregs obtained from 1080 L-glass fiber fabrics impregnated with each specimen (each example or comparative example) are prepared and stacked in the order of one copper foil, two prepregs and one copper foil, followed by lamination under vacuum at 420 psi and 200° C. for 2 hours to form a copper-clad laminate (2-ply, formed by lamination of two prepregs). Next, the copper-clad laminate (2-ply) described above is etched to remove the copper foils on both sides to obtain a copper-free laminate (2-ply), which is formed by laminating two prepregs and has a resin content of about 70%.

Each testing method and the properties are described below.

1. Glass Transition Temperature (Tg)

The copper-free laminate (8-ply) is selected as a specimen. A dynamic mechanical analyzer (DMA) is used by reference to IPC-TM-650 2.4.24.4 to measure the glass transition temperature (in ° C.) of each specimen. Temperature interval during the measurement was set at 50 to 400° C. with a temperature increasing rate of 2° C./minute. The higher glass transition temperature is better.

2. Dielectric Constant (Dk) and Dissipation Factor (Df)

The copper-free laminate (2-ply) is selected as a specimen. A microwave dielectrometer available from AET Corp. is used by reference to JISC2565 to measure each specimen at 10 GHz at room temperature (about 25° C.). Lower dielectric constant and dissipation factor represent better dielectric properties of the specimen. At a frequency of 10 GHz, for a Df value of less than 0.005, a difference in Df value of greater than or equal to 0.0001 represents a significant difference between dissipation factors of different laminates (i.e. significant technical difficulty is present).

3. Flame Retardancy

The copper-free laminate (8-ply) (125 mm×13 mm) is selected as a specimen. The flame retardancy is measured by reference to UL94, and the results are represented by V0, V1, or V2, wherein the flame retardancy of V0 is better than the flame retardancy of V1, and the flame retardancy of V1 is better than the flame retardancy of V2. It is the worst flame retardancy when the specimen is completely burned.

4. Percent Thermal Expansion at Z-axis (Z-PTE)

The copper-free laminate (8-ply) is selected as a specimen. Thermal mechanical analysis(TMA) is performed on the specimen. The specimens are heated from 50 to 260° C. at a temperature increasing rate of 10° C./minute. The percent thermal expansion (i.e., ratio of thermal expansion) at Z-axis (in %) of each specimen is measured by reference to IPC-TM-650 2.4.24.5 between 50° C. and 260° C. The lower percent thermal expansion at Z-axis is better. In terms of the copper-clad laminate with percent thermal expansion at Z-axis below 2.0%, a difference in percent thermal expansion at Z-axis of greater than or equal to 0.1% represents a significant difference.

5. Water Absorption Rate

The copper-free laminate (8-ply) (2 inch×2 inch) is selected as a specimen, which is, by reference to IPC-TM-650 2.6.2.1, placed in a 105±10° C. oven and baked for 1 hour and then cooled at room temperature (about 25° C.) for 10 minutes, and then the copper-free laminate is weighed as $W_1$. By reference to IPC-TM-650 2.6.16.1, the copper-free laminate then undergoes a pressure cooking test (PCT) for 3 hours of moisture absorption (test temperature at 121° C., and relative humidity 100%). After taking out and cooling the copper-free laminate, and wiping out the water on the surface of the copper-free laminate, the copper-free laminate is weighed as $W_2$. The water absorption rate is calculated by the following formula:

$$\text{Water Absorption Rate (\%)} = [(W_2 - W_1)/W_1] \times 100\%$$

6. Interlayer Bonding Strength

The copper-clad laminate (8-ply) is cut into a rectangular with a width of 12.7 mm and a length greater than 60 mm, which is measured by a universal tensile strength tested by reference to IPC-TM-650 2.4.8. The surface of the copper foil is not necessarily etched during the process, and the position for testing is at the contact surface between the second layer of the prepreg and the third layer of the prepreg. The force (lb/in) of separating the two layers of the insulated layer after cured is tested at room temperature (about 25° C.). For the copper-clad laminate with a measured Df value of less than 0.005 at a frequency of 10 GHz, a difference in interlayer bonding strength of greater than or equal to 0.1 lb/in represents a significant difference.

7. Alkali Resistance

The copper-free laminate (8-ply) is selected as a specimen, which is cut into three strips of 40 mm×20 mm specimens, placed in a 105° C. oven and baked for 2 hours, and then soaked in a 20% NaOH solution at 90° C. The specimens are removed with a 5-minute interval and visually inspected to determine the appearance of whitening or weave exposure, and the soaking time is recorded. The absence of whitening or weave exposure means that the specimen passes the alkali resistance test during the soaking time. The appearance of whitening or weave exposure means that the specimen fails the alkali resistance test during the soaking time. In this case, the same specimen needs to be prepared and tested again, which is removed with a 1-minute interval and visually inspected to determine the appearance of whitening or weave exposure, and the soaking time is recorded. The longer time means the better alkali resistance.

The raw materials described below are used to prepare for the resin compositions of the examples and the comparative examples of the present disclosure according to the amount disclosed in Table 1 to Table 4, and are further made into various specimens.

The chemical raw materials used in the examples and the comparative examples of the present disclosure as described below:

Phosphorus-containing compounds P1-P6 represented by Formula (1): prepared by Applicant and described in detail below.

Compound V1: prepared by Applicant and described in detail below.

Compound D1 having the formula below: prepared by Applicant.

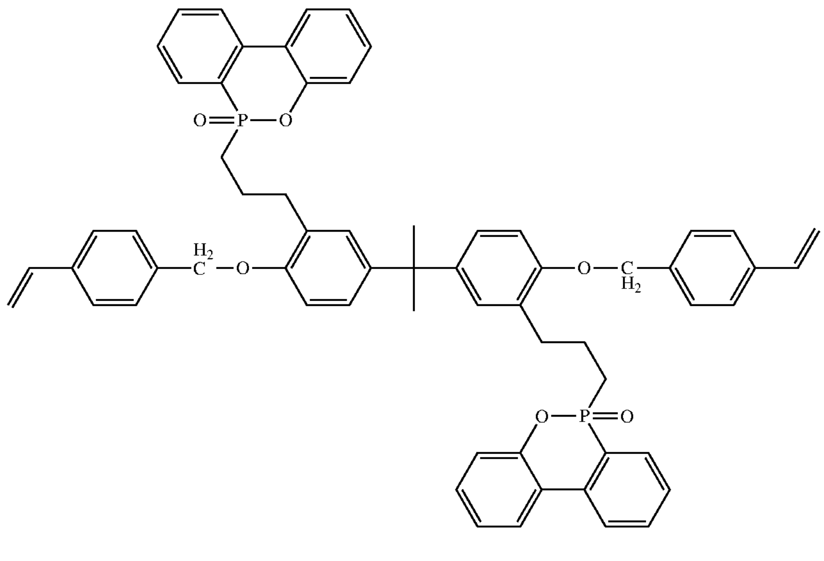 [SMILES: C=Cc1ccc(COc2ccc(C(C)(C)c3ccc(OCc4ccc(C=C)cc4)c(CCCP4(=O)Oc5ccccc5-c5ccccc54)c3)cc2CCCP2(=O)Oc3ccccc3-c3ccccc32)cc1]

Compound D2: prepared by Applicant and described below.

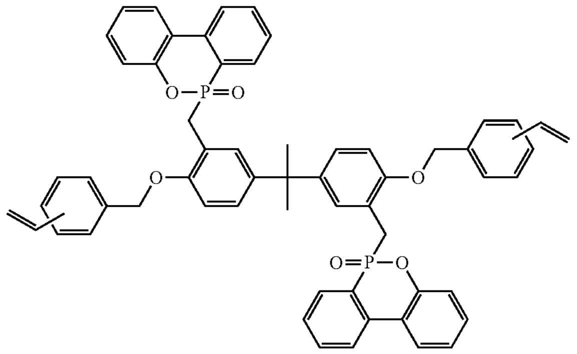

Compound D3: prepared by Applicant and described below.

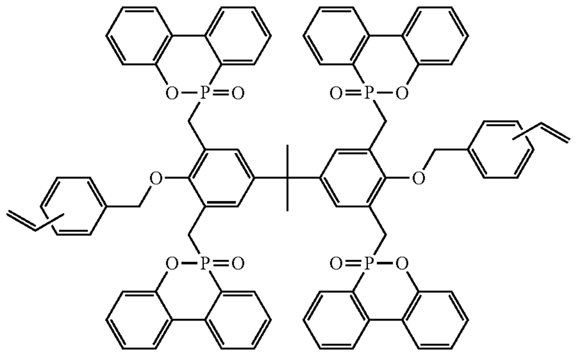

Compound D4: prepared by Applicant and described below.

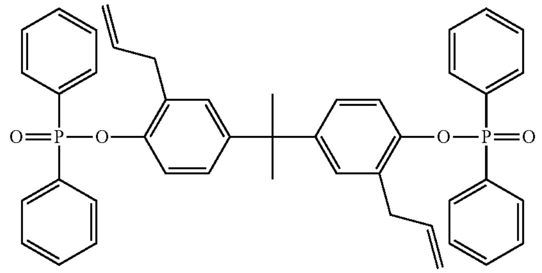 [SMILES: C=CCc1cc(C(C)(C)c2ccc(OP(=O)(c3ccccc3)c3ccccc3)c(CC=C)c2)ccc1OP(=O)(c1ccccc1)c1ccccc1]

Compound D5: prepared by Applicant and described below.

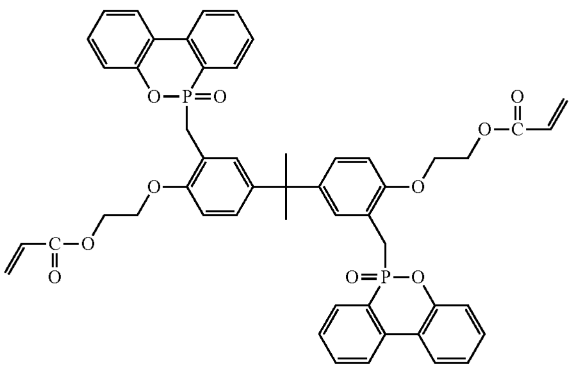 [SMILES: C=CC(=O)OCCOc1ccc(C(C)(C)c2ccc(OCCOC(=O)C=C)c(CP3(=O)Oc4ccccc4-c4ccccc43)c2)cc1CP1(=O)Oc2ccccc2-c2ccccc21]

Compound D6: prepared by Applicant and described below.

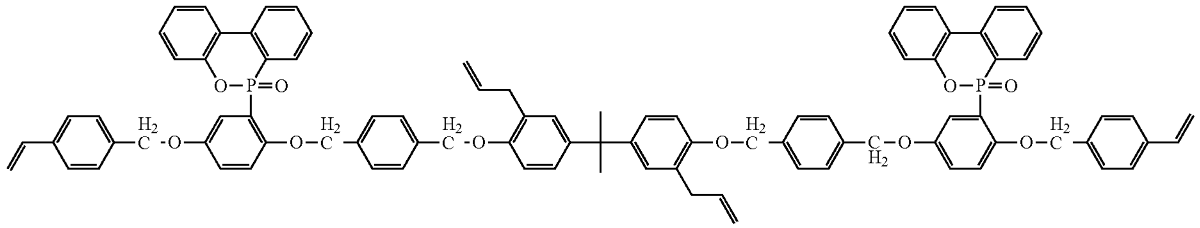 [SMILES: C=CCc1cc(C(C)(C)c2ccc(OCc3ccc(COc4ccc(OCc5ccc(C=C)cc5)cc4P4(=O)Oc5ccccc5-c5ccccc54)cc3)c(CC=C)c2)ccc1OCc1ccc(COc2ccc(OCc3ccc(C=C)cc3)c(P3(=O)Oc4ccccc4-c4ccccc43)c2)cc1]

SA9000: methylacryloyl-containing polyphenylene ether resin with Mn of about 1900 to 2300, available from Sabic.

OPE-2st 1200: vinylbenzyl-containing polyphenylene ether resin with Mn of about 1200, available from Mitsubishi Gas Chemical Co., Inc.

OPE-2st 2200: vinylbenzyl-containing polyphenylene ether resin with Mn of about 2200, available from Mitsubishi Gas Chemical Co., Inc.

DABPA: diallyl bisphenol A, available from Laizhou City Laiyu Chemical Co., Ltd.

C1792: vinylbenzyl chloride, available from TCI (Shanghai) Development Co., Ltd.

DPO: diphenylphosphine oxide, available from Peking J&K Scientific Ltd.

DVB: divinylbenzene, available from Shanghai Macklin Biochemical Co., Ltd.

BVPE: bis(vinylphenyl) ethane, available from Linchuan Chemical Co., Ltd.

25B: 2,5-dimethyl-2,5-di(t-butylperoxy)-3-hexyne, available from NOF Corporation.

SC-2500 SVJ: spherical silica pre-treated by silane coupling agent, available from Admatechs.

The mixture solvent of toluene and butanone: the weight ratio of toluene to butanone is 1:1. Toluene and butanone are commercially available. The content is indicated by "proper amount", which represents the amount of the toluene and butanone is adjusted such that the resin composition has a solid content of 60% to 68% (solid content, S/C=60% to 68%).

Preparation Example 1: Phosphorus-Containing Compound P1

DABPA 30.8 g (0.1 moles), DPO 40.4 g (0.2 moles), xylene 50 mL are added into a three-necked flask and stirred at 140° C. for 4 hours to obtain DABPA-DPO solution, an intermediate compound. The solution is cooled to normal temperature, and toluene 50 mL, tetrabutylammonium bromide 16.1 g (0.05 moles) and 20% NaOH (0.3 moles) solution 60 g are added into the solution. Under high-speed stirring, p-chloromethyl styrene in toluene solution of 36.7 g (0.24 moles) is dropwise added therein within 30 minutes to react for 2 hours, followed by heated to 65° C. to react for 4 hours. Then, the solution is cooled to room temperature and centrifuged to remove the aqueous phase, and the organic phase is precipitated with methanol, washed with water, and dried to obtain phosphorus-containing compound P1 as illustrated in Formula (7).

Formula (7)

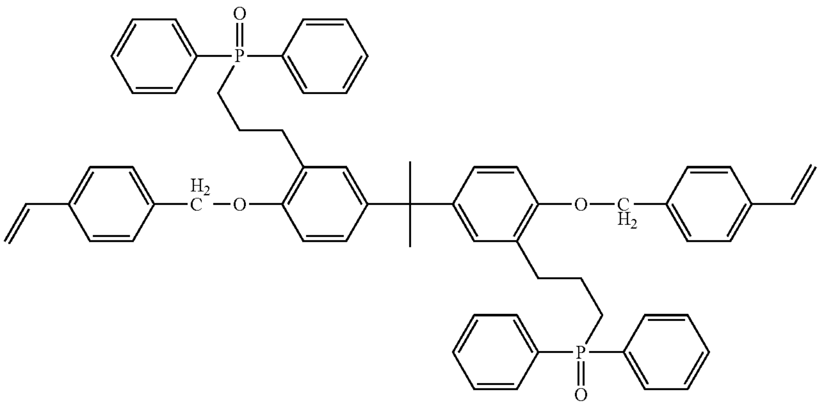

Product P1 obtained from Preparation Example 1 is analyzed by Fourier transform infrared spectroscopy (FTIR). The result is illustrated in FIG. 1. The FTIR spectrum reveals a peak indicative of the stretching vibration of C—H of methyl group in DABPA at 2941.9 $cm^{-1}$, peaks indicative of the characteristic absorption of benzene ring in DABPA at 1507.8 $cm^{-1}$ and 1410.5 $cm^{-1}$, a peak indicative of the characteristic absorption of benzene ring in DPO at 1434.9 $cm^{-1}$, and 949 $cm^{-1}$, 1185 $cm^{-1}$ correspond to the P—H bond characteristic absorption peak and P=O double bond stretching vibration peak in DPO, respectively, P—H bond disappears after DPO and DABPA undergo an addition reaction to generate P—C bond. Therefore, the characteristic peak at 949 $cm^{-1}$ disappears while the characteristic peak of P=O migrates to 1181.8 $cm^{-1}$. The peak indicative of the characteristic absorption of O—H in DABPA at 3445 $cm^{-1}$ completely disappears after vinylbenzyl chloride reacts with hydroxyl group in DABPA, and the peaks indicative of the bending vibration of C—H of C=C double bond at 902 $cm^{-1}$ and 993 $cm^{-1}$ appear. This proves that the phosphorus-containing compound P1 is successfully synthesized.

Preparation Example 2: Phosphorus-Containing Compound P2

DABPA 30.8 g (0.1 moles), DPO 40.4 g (0.2 moles), xylene 50 mL are added into a three-necked flask and stirred at 140° C. for 4 hours to obtain DABPA-DPO solution, an intermediate compound. The solution is cooled to normal temperature, and toluene 50 mL, tetrabutylammonium bromide 16.1 g (0.05 moles) and 20% NaOH (0.3 moles) solution 60 g are added into the solution. Under high-speed stirring bromopropene in toluene solution of 29.0 g (0.24 moles) is dropwise added therein within 30 minutes to react for 2 hours, followed by heated to 60° C. to react for 3 hours. Then, the solution is cooled to room temperature and centrifuged to remove the aqueous phase, and the organic phase is precipitated with methanol, washed with water, and dried to obtain phosphorus-containing compound P2 as illustrated in Formula (8).

Formula (8)

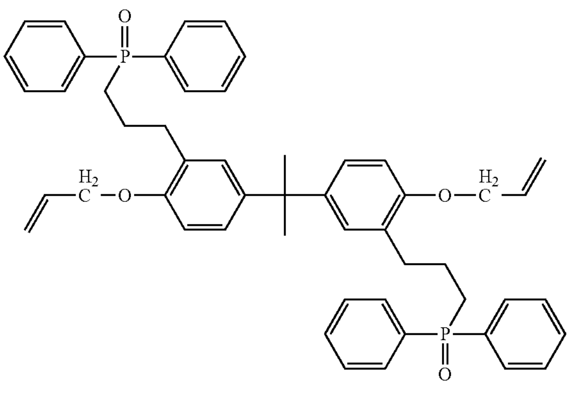

Preparation Example 3: Phosphorus-Containing Compound P3

DABPA 30.8 g (0.1 moles), DPO 40.4 g (0.2 moles), xylene 50 mL are added into a three-necked flask and stirred at 140° C. for 4 hours to obtain DABPA-DPO solution, an intermediate compound. The solution is cooled to normal temperature, and toluene 50 mL, tetrabutylammonium bromide 16.1 g (0.05 moles) and 20% NaOH (0.3 moles) solution 60 g are added into the solution. Under high-speed stirring, methylacryloyl bromide in toluene solution of 25.2 g (0.24 moles) is dropwise added therein within 30 minutes to react for 2 hours, followed by heated to 55° C. to react for 2 hours. Then, the solution is cooled to room temperature and centrifuged to remove the aqueous phase, and the organic phase is precipitated with methanol, washed with water, and dried to obtain phosphorus-containing compound P3 as illustrated in Formula (9).

Formula (9)

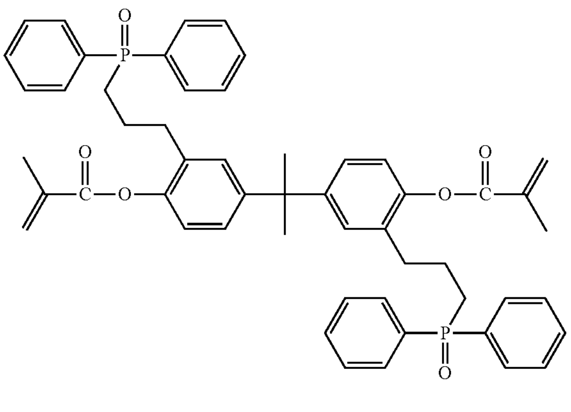

Preparation Example 4: Phosphorus-Containing Compound P4

DABPA 30.8 g (0.1 moles), diphenyl phosphate 46.8 g (0.2 moles), xylene 50 mL are added into a three-necked flask and stirred at 150° C. for 4 hours to obtain solution of intermediate compound. The solution is cooled to normal temperature, and toluene 50 mL, tetrabutylammonium bromide 16.1 g (0.05 moles) and 20% NaOH (0.3 moles) solution 60 g are added into the solution. Under high-speed stirring, methylacryloyl bromide in toluene solution of 25.2 g (0.24 moles) is dropwise added therein within 30 minutes to react for 2 hours, followed by heated to 55° C. to react for 2 hours. Then, the solution is cooled to room temperature and centrifuged to remove the aqueous phase, and the organic phase is precipitated with methanol, washed with water, and dried to obtain phosphorus-containing compound P4 as illustrated in Formula (10).

Formula (10)

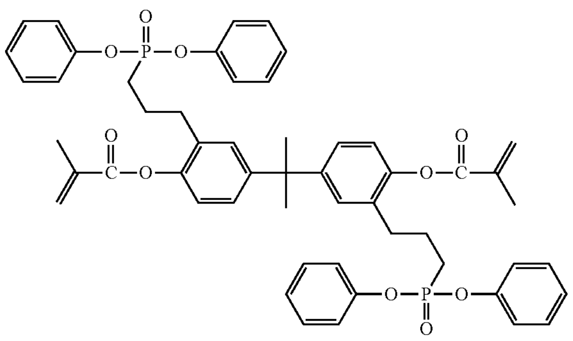

Preparation Example 5: Phosphorus-Containing Compound P5

DABPA 30.8 g (0.1 moles), bis(2,6-dimethylphenyl) phosphate 58.1 g (0.2 moles), xylene 50 mL are added into a three-necked flask and stirred at 140° C. for 4 hours to obtain solution of intermediate compound. The solution is cooled to normal temperature, and toluene 50 mL, tetrabutylammonium bromide 16.1 g (0.05 moles) and 20% NaOH (0.3 moles) solution 60 g are added into the solution. Under high-speed stirring, methylacryloyl bromide in toluene solution of 25.2 g (0.24 moles) is dropwise added therein within 30 minutes to react for 2 hours, followed by heated to 55° C. to react for 2 hours. Then, the solution is cooled to room temperature and centrifuged to remove the aqueous phase, and the organic phase is precipitated with methanol, washed with water, and dried to obtain phosphorus-containing compound P5 as illustrated in Formula (11).

Formula (11)

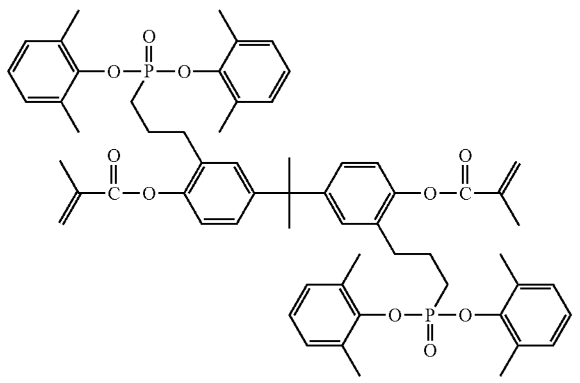

Preparation Example 6: Phosphorus-Containing Compound P6

5,5'-diallyl-2,2'-biphenyldiol 26.6 g (0.1 moles), DPO 40.4 g (0.2 moles), xylene 50 mL are added into a three-necked flask and stirred at 145° C. for 5 hours to obtain solution of intermediate compound. The solution is cooled to normal temperature, and toluene 50 mL, tetrabutylammonium bromide 16.1 g (0.05 moles) and 20% NaOH (0.3 moles) solution 60 g are added into the solution. Under high-speed stirring, methylacryloyl bromide in toluene solution of 25.2 g (0.24 moles) is dropwise added therein within 30 minutes to react for 2 hours, followed by heated to 55° C. to react for 3 hours. Then, the solution is cooled to room temperature and centrifuged to remove the aqueous phase, and the organic phase is precipitated with methanol, washed with water, and dried to obtain phosphorus-containing compound P6 as illustrated in Formula (14).

Formula (14)

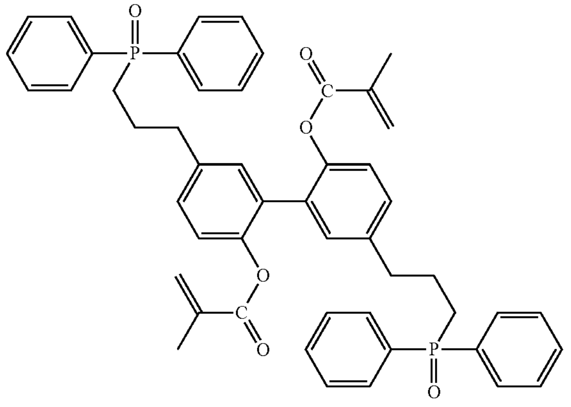

Preparation Example 7: Compound V1

DABPA 30.8 g (0.1 moles), toluene 50 mL, tetrabutylammonium bromide 16.1 g (0.05 moles) and 20% NaOH (0.3 moles) solution 60 g are added into a three-necked flask. Under high-speed stirring, the solution is heated to 65° C. P-chloromethyl styrene in toluene solution of 36.7 g (0.24 moles) is dropwise added therein within 30 minutes to react for 5 hours. Then, the solution is cooled to room temperature and centrifuged to remove the aqueous phase, and the organic phase is precipitated with methanol, washed with water, and dried to obtain compound V1.

(V1)

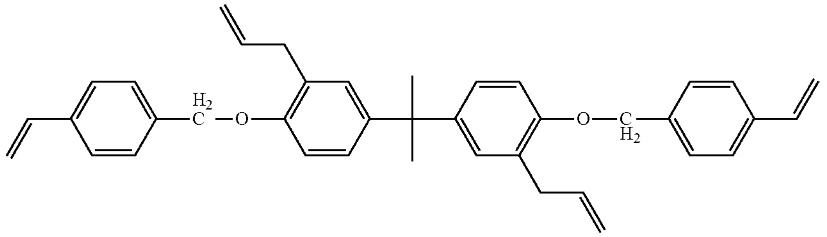

The contents of the resin composition (in part by weight) of the examples and the comparative examples and the testing results of the properties of specimens are illustrated in Table 1 to Table 4.

TABLE 1

The contents of the resin composition (in part by weight) of Examples E1 to E6 and the testing results of the properties of articles made therefrom.

| component | | E1 | E2 | E3 | E4 | E5 | E6 |
|---|---|---|---|---|---|---|---|
| unsaturated C═C double bond-containing polyphenylene ether resin | SA9000 | 100 | 100 | 100 | 100 | 100 | 100 |
| | OPE-2st 1200 | — | — | — | — | — | — |
| | OPE-2st 2200 | — | — | — | — | — | — |
| phosphorus-containing compound | P1 | 40 | — | — | — | — | — |
| | P2 | — | 40 | — | — | — | — |
| | P3 | — | — | 40 | — | — | — |

TABLE 1-continued

The contents of the resin composition (in part by weight) of Examples E1 to E6 and the testing results of the properties of articles made therefrom.

| | | | | | | | |
|---|---|---|---|---|---|---|---|
| represented by Formula (1) | P4 | — | — | — | 40 | — | — |
| | P5 | — | — | — | — | 40 | — |
| | P6 | — | — | — | — | — | 40 |
| V1 | | — | — | — | — | — | — |
| DABPA | | — | — | — | — | — | — |
| C1792 | | — | — | — | — | — | — |
| DPO | | — | — | — | — | — | — |
| D1 | | — | — | — | — | — | — |
| D2 | | — | — | — | — | — | — |
| D3 | | — | — | — | — | — | — |
| D4 | | — | — | — | — | — | — |
| D5 | | — | — | — | — | — | — |
| D6 | | — | — | — | — | — | — |
| unsaturated C═C double bond-containing crosslinking agent | DVB | — | — | — | — | — | — |
| | BVPE | — | — | — | — | — | — |
| curing accelerator | 25B | 1 | 1 | 1 | 1 | 1 | 1 |
| inorganic filler | SC2500-SVJ | 120 | 120 | 120 | 120 | 120 | 120 |
| solvent | mixture of toluene and butanone | PA | PA | PA | PA | PA | PA |
| **property** | **unit** | **E1** | **E2** | **E3** | **E4** | **E5** | **E6** |
| Tg | ° C. | 220 | 210 | 225 | 223 | 221 | 221 |
| Dk | / | 3.20 | 3.20 | 3.23 | 3.24 | 3.22 | 3.21 |
| Df | / | 0.0023 | 0.0023 | 0.0024 | 0.0024 | 0.0023 | 0.0025 |
| flame retardancy | / | V0 | V0 | V0 | V0 | V0 | V0 |
| Z-PTE | % | 1.8 | 2.0 | 1.4 | 1.6 | 1.7 | 1.6 |
| water absorption rate | % | 0.30 | 0.28 | 0.33 | 0.32 | 0.28 | 0.34 |
| interlayer bonding strength | lb/in | 3.1 | 3.0 | 3.7 | 3.6 | 3.3 | 3.5 |
| alkali resistance | minute | 20 | 20 | 18 | 15 | 16 | 16 |

(PA represents proper amount.)

TABLE 2

The contents of the resin composition (in part by weight) of Examples E7 to E10 and the testing results of the properties of articles made therefrom.

| composition | | E7 | E8 | E9 | E10 |
|---|---|---|---|---|---|
| unsaturated C═C double bond-containing polyphenylene ether resin | SA9000 | 100 | 100 | 60 | 50 |
| | OPE-2st 1200 | — | — | 20 | 10 |
| | OPE-2st 2200 | — | — | 20 | 40 |
| phosphorus-containing compound represented by Formula (1) | P1 | — | — | — | — |
| | P2 | — | — | — | — |
| | P3 | 20 | 60 | 20 | 35 |
| | P4 | — | — | 10 | 10 |
| | P5 | — | — | — | 5 |
| | P6 | — | — | — | — |
| V1 | | — | — | — | — |
| DABPA | | — | — | — | — |
| C1792 | | — | — | — | — |
| DPO | | — | — | — | — |
| D1 | | — | — | — | — |
| D2 | | — | — | — | — |
| D3 | | — | — | — | — |
| D4 | | — | — | — | — |
| D5 | | — | — | — | — |
| D6 | | — | — | — | — |
| unsaturated C═C double bond-containing crosslinking agent | DVB | — | — | 20 | — |
| | BVPE | — | — | — | 1 |
| curing accelerator | 25B | 1 | 1 | 0.1 | 3 |

TABLE 2-continued

The contents of the resin composition (in part by weight) of Examples E7 to E10 and the testing results of the properties of articles made therefrom.

| | | | | | |
|---|---|---|---|---|---|
| inorganic filler | SC2500-SVJ | 120 | 120 | 60 | 200 |
| solvent | mixture of toluene and butanone | PA | PA | PA | PA |
| property | unit | E7 | E8 | E9 | E10 |
| Tg | ° C. | 221 | 230 | 235 | 232 |
| Dk | / | 3.17 | 3.19 | 3.23 | 3.21 |
| Df | / | 0.0024 | 0.0025 | 0.0022 | 0.0024 |
| flame retardancy | / | V0 | V0 | V0 | V0 |
| Z-PTE | % | 1.7 | 1.4 | 1.3 | 1.2 |
| water absorption rate | % | 0.31 | 0.34 | 0.25 | 0.27 |
| interlayer bonding strength | lb/in | 3.5 | 3.7 | 3.6 | 3.5 |
| alkali resistance | minute | 25 | 16 | 25 | 21 |

(PA represents proper amount.)

TABLE 3

The contents of the resin composition (in part by weight) of Comparative Examples C1 to C5 and the testing results of the properties of articles made therefrom.

| component | | C1 | C2 | C3 | C4 | C5 |
|---|---|---|---|---|---|---|
| unsaturated C═C double bond-containing polyphenylene ether resin | SA9000 | 100 | 100 | 100 | 100 | 100 |
| | OPE-2st 1200 | — | — | — | — | — |
| | OPE-2st 2200 | — | — | — | — | — |
| phosphorus-containing compound represented by Formula (1) | P1 | 10 | 75 | — | — | — |
| | P2 | — | — | — | — | — |
| | P3 | — | — | — | — | — |
| | P4 | — | — | — | — | — |
| | P5 | — | — | — | — | — |
| | P6 | — | — | — | — | — |
| V1 | | — | — | 22.9 | — | — |
| DABPA | | — | — | — | 13.1 | — |
| C1792 | | — | — | — | 13.0 | — |
| DPO | | — | — | 17.1 | 17.1 | — |
| D1 | | — | — | — | — | 40 |
| D2 | | — | — | — | — | — |
| D3 | | — | — | — | — | — |
| D4 | | — | — | — | — | — |
| D5 | | — | — | — | — | — |
| D6 | | — | — | — | — | — |
| unsaturated C═C double bond-containing crosslinking agent | DVB | — | — | — | — | — |
| | BVPE | — | — | — | — | — |
| curing accelerator | 25B | 1 | 1 | 1 | 1 | 1 |
| inorganic filler | SC2500-SVJ | 120 | 120 | 120 | 120 | 120 |
| solvent | mixture of toluene and butanone | PA | PA | PA | PA | PA |
| property | unit | C1 | C2 | C3 | C4 | C5 |
| Tg | ° C. | 205 | 215 | 201 | 185 | 210 |
| Dk | / | 3.18 | 3.28 | 3.40 | 3.45 | 3.27 |
| Df | / | 0.0024 | 0.0027 | 0.0048 | 0.0065 | 0.0026 |
| flame retardancy | / | V2 | V0 | V1 | V0 | V0 |
| Z-PTE | % | 2.1 | 1.8 | 2.1 | 2.5 | 1.7 |
| water absorption rate | % | 0.39 | 0.42 | 0.55 | 0.68 | 0.37 |
| interlayer bonding strength | lb/in | 2.1 | 2.5 | 2.3 | 1.8 | 2.9 |
| alkali resistance | minute | >25 | 5 | 3 | 2 | 10 |

(PA represents proper amount.)

TABLE 4

The contents of the resin composition (in part by weight) of Comparative Examples C6 to C10 and the testing results of the properties of articles made therefrom.

| composition | | C6 | C7 | C8 | C9 | C10 |
|---|---|---|---|---|---|---|
| unsaturated C═C double bond-containing polyphenylene ether resin | SA9000 | 100 | 100 | 100 | 100 | 100 |
| | OPE-2st 1200 | — | — | — | — | — |
| | OPE-2st 2200 | — | — | — | — | — |
| phosphorus-containing compound represented by Formula (1) | P1 | — | — | — | — | — |
| | P2 | — | — | — | — | — |
| | P3 | — | — | — | — | — |
| | P4 | — | — | — | — | — |
| | P5 | — | — | — | — | — |
| | P6 | — | — | — | — | — |
| V1 | | — | — | — | — | — |
| DABPA | | — | — | — | — | — |
| C1792 | | — | — | — | — | — |
| DPO | | — | — | — | — | — |
| D1 | | — | — | — | — | — |
| D2 | | 40 | — | — | — | — |
| D3 | | — | 40 | — | — | — |
| D4 | | — | — | 40 | — | — |
| D5 | | — | — | — | 40 | — |
| D6 | | — | — | — | — | 40 |
| unsaturated C=C double bond-containing crosslinking agent | DVB | — | — | — | — | — |
| | BVPE | — | — | — | — | — |
| curing accelerator | 25B | 1 | 1 | 1 | 1 | 1 |
| inorganic filler | SC2500-SVJ | 120 | 120 | 120 | 120 | 120 |
| solvent | mixture of toluene and butanone | PA | PA | PA | PA | PA |

| property | unit | C6 | C7 | C8 | C9 | C10 |
|---|---|---|---|---|---|---|
| Tg | ° C. | 217 | 214 | 207 | 210 | 222 |
| Dk | / | 3.26 | 3.25 | 3.25 | 3.28 | 3.35 |
| Df | / | 0.0033 | 0.0031 | 0.0025 | 0.0034 | 0.0035 |
| flame retardancy | / | V0 | V0 | V0 | V0 | V0 |
| Z-PTE | % | 2.1 | 1.9 | 2.2 | 1.9 | 1.5 |
| water absorption rate | % | 0.38 | 0.45 | 0.36 | 0.44 | 0.43 |
| interlayer bonding strength | lb/in | 2.7 | 2.5 | 2.4 | 2.9 | 2.8 |
| alkali resistance | Minute | 5 | 3 | 8 | 4 | 15 |

(PA represents proper amount.)

The following observations can be made from Table 1 to Table 4.

1. With respect to a total of 100 parts by weight of the unsaturated C═C double bond-containing polyphenylene ether resin, Examples E1 to E10 which use 20 to 60 parts by weight of the phosphorus-containing compounds represented by Formula (1) have a significant improvement in the following properties: water absorption rate and interlayer bonding strength, compared to the comparative examples which use 10 parts by weight of the phosphorus-containing compound represented by Formula (1) (Comparative Example C1) and 75 parts by weight of the phosphorus-containing compounds represented by Formula (1) (Comparative Example C2). Among them, the water absorption rates of the specimens of Comparative Examples C1 and C2 are all greater than 0.34% while the water absorption rates of the specimens of Examples E1 to E10 are all less than or equal to 0.34%; and the interlayer bonding strengths of the specimens of Comparative Examples C1 and C2 are all less than 3.0 lb/in while the interlayer bonding strengths of the specimens of Examples E1 to E10 are all greater than or equal to 3.0 lb/in.

2. Examples E1 to E10 which use the phosphorus-containing compounds represented by Formula (1) have a significant improvement in the following properties: Tg, Dk, Df, Z-PTE, water absorption rate, interlayer bonding strength and alkali resistance, compared to the comparative examples which use the mixture of V1 and DPO (Comparative Example C3) and the mixture of DABPA, vinylbenzyl chloride and DPO (Comparative Example C4). Among them, Tg of the specimens of Comparative Examples C3 and C4 are all less than 210° C. while Tg of the specimens of Examples E1 to E10 are all greater than or equal to 210° C.; Dk of the specimens of Comparative Examples C3 and C4 are all greater than 3.24 while Dk of the specimens of Examples E1 to E10 are all less than or equal to 3.24; Df of the specimens of Comparative Examples C3 and C4 are all greater than 0.0025 while Df of the specimens of Examples E1 to E10 are all less than or equal to 0.0025; Z-PTE of the specimens of Comparative Examples C3 and C4 are all greater than 2.0% while Z-PTE of the specimens of Examples E1 to E10 are all less than or equal to 2.0%; the water absorption rates of the specimens of Comparative Examples C3 and C4 are all greater than 0.34% while the water absorption rates of the specimens of Examples E1 to E10 are all less than or equal to 0.34%; the interlayer bonding strengths of the specimens of Comparative Examples C1 and C2 are all less than 3.0 lb/in while the interlayer bonding strengths of the specimens of Examples E1 to E10 are all greater than or equal to 3.0 lb/in; and the alkali resistance of the specimens of Comparative Examples C1 and C2 are all less than 15 minutes while the alkali resistance of the specimens of Examples E1 to E10 are all greater than or equal to 15 minutes.

3. Examples E1 to E10 which use phosphorus-containing compounds represented by Formula (1) have a significant improvement in the following properties: Dk, water absorption rate and interlayer bonding strength, compared to the comparative examples which use other structure compound (Comparative Examples C5 to C10). Among them, Dk of the specimens of Comparative Examples C5 to C10 are all greater than 3.24 while Dk of the specimens of Examples E1 to E10 are all less than or equal to 3.24; water absorption rates of the specimens of Comparative Examples C5 to C10 are all greater than 0.34% while water absorption rates of the specimens of Examples E1 to E10 are all less than or equal to 0.34%; interlayer bonding strengths of the specimens of Comparative Examples C5 to C10 are all less than 3.0 lb/in while interlayer bonding strengths of the specimens of Examples E1 to E10 are all greater than or equal to 3.0 lb/in.

4. Furthermore, Example E1 uses the phosphorus-containing compound terminated with a vinylbenzyl group, Example E2 uses the phosphorus-containing compound terminated with an allyl group, and Examples E3 to E10 use the phosphorus-containing compounds terminated with a methylacryloyl group. Compared to using the phosphorus-containing compounds terminated with a vinylbenzyl group or an allyl group, using the phosphorus-containing compounds terminated with a methylacryloyl group has an overall significant improvement in the following properties: Tg, Z-PTE, and interlayer bonding strength. Among them, Tg of the specimens of Examples E1 and E2 are all less than or equal to 220° C. while Tg of the specimens of Examples E3 to E10 are all greater than 220° C.; Z-PTE of the specimens of Examples E1 and E2 are all greater than or equal to 1.8% while Z-PTE of the specimens of Examples E3 to E10 are all less than 1.8%; and the interlayer bonding strength of the specimens of Examples E1 and E2 are all less than or equal to 3.0 lb/in while the interlayer bonding strength of the specimens of Examples E3 to E10 are all greater than 3.0 lb/in.

What is claimed is:

1. A resin composition, comprising:

(A) 100 parts by weight of an unsaturated C═C double bond-containing polyphenylene ether resin; and (B) 20 parts by weight to 60 parts by weight of a phosphorus-containing compound represented by Formula (1), Formula (1)

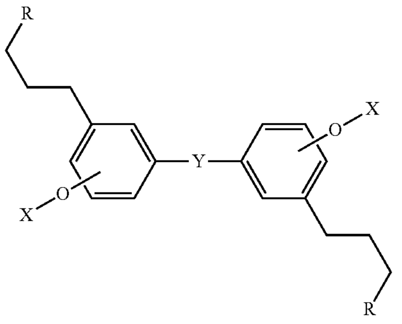

wherein in Formula (1), each of X is independently a group represented by Formula (2), Formula (3) or Formula (4), Y is a covalent bond or a C1 to C3 alkyl group, and each of R is independently a group represented by Formula (5) or Formula (6), Formula (2)

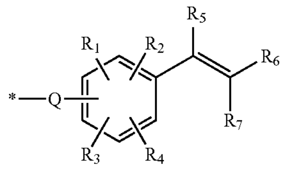

Formula (3)

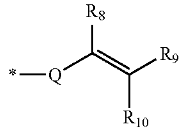

Formula (4)

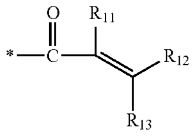

Formula (5)

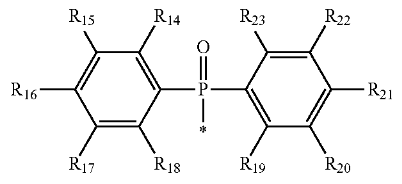

Formula (6)

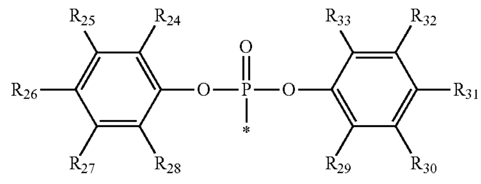

wherein each of $R_1$ to $R_{33}$ is independently a hydrogen atom or a C1 to C3 alkyl group, and each of Q is independently a covalent bond or a C1 to C3 alkyl group.

2. The resin composition according to claim 1, wherein in Formula (1), each of X is independently a vinyl group, a vinylbenzyl group, an allyl group, or a (meth)acryloyl group.

3. The resin composition according to claim 1, wherein the phosphorus-containing compound represented by Formula (1) comprises any one of phosphorus-containing compounds represented by Formula (7) to Formula (14), or a combination thereof, Formula (7)
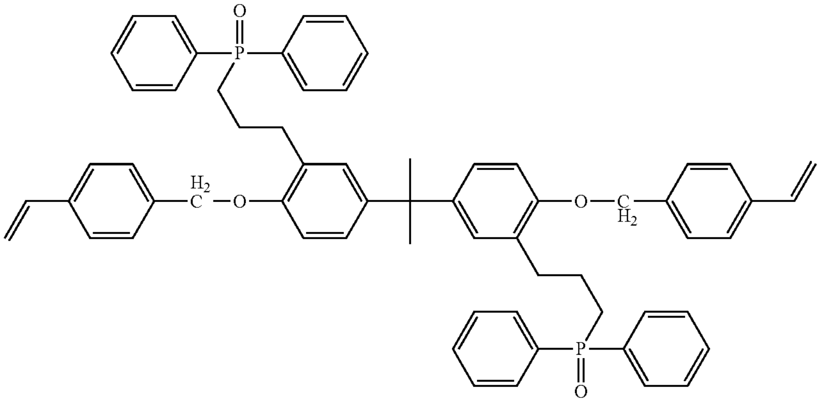
Formula (8)
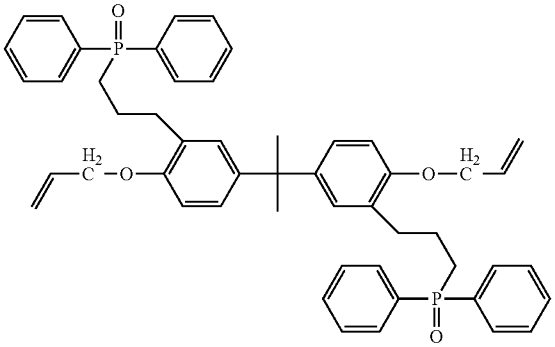
Formula (9)
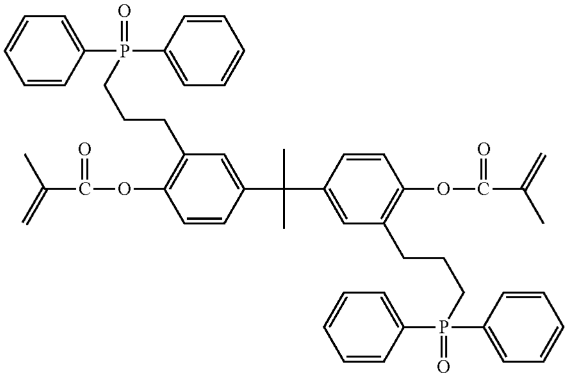
Formula (10)
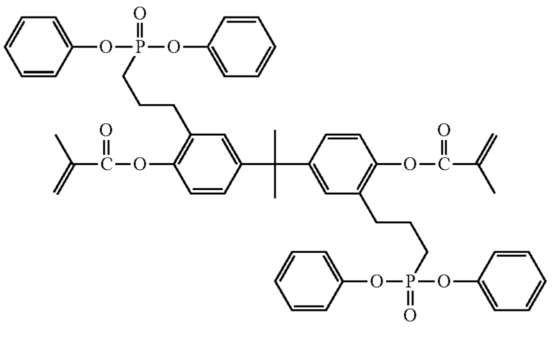
Formula (11)
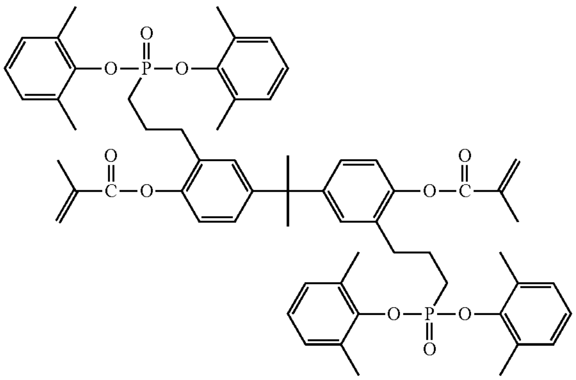
Formula (12)
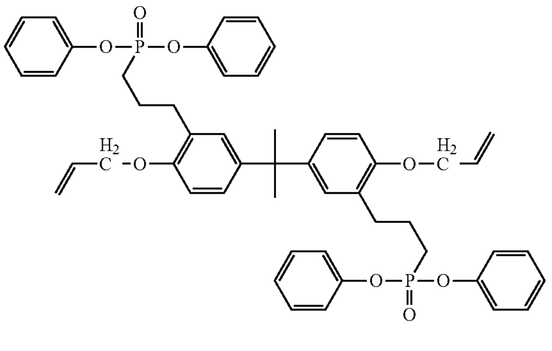
Formula (13)
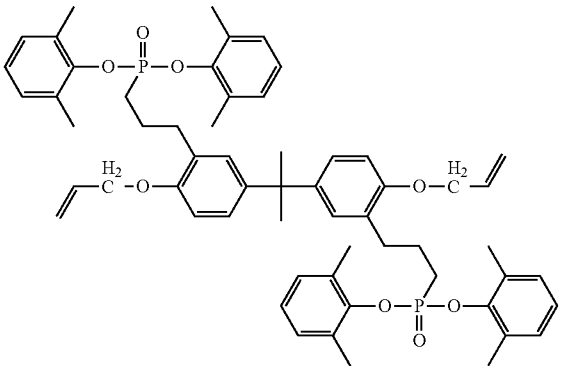

-continued

Formula (14)

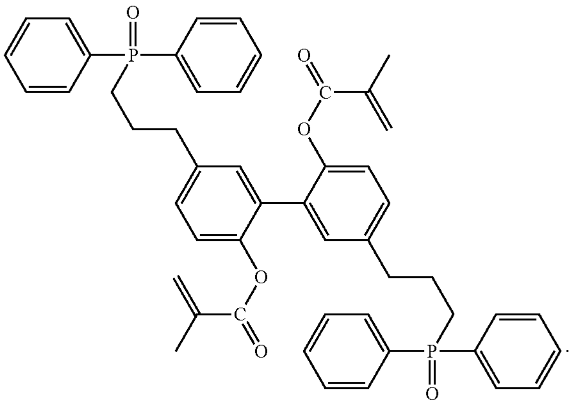

4. The resin composition according to claim 1, wherein the unsaturated C═C double bond-containing polyphenylene ether resin comprises any one of a (meth)acryloyl-containing polyphenylene ether resin, a vinylbenzyl-containing polyphenylene ether resin, and a vinyl-containing polyphenylene ether resin, or a combination thereof.

5. The resin composition according to claim 1, wherein the resin composition further comprises any one of a polyolefin, an organic silicone resin, a benzoxazine resin, an epoxy resin, a polyester resin, a phenol resin, an amine curing agent, a polyamide, a polyimide, a styrene maleic anhydride, a maleimide resin, a cyanate ester resin, and a maleimide triazine resin, or a combination thereof.

6. The resin composition according to claim 1, wherein the resin composition further comprises an unsaturated C═C double bond-containing crosslinking agent, the unsaturated C═C double bond-containing crosslinking agent is any one of bis(vinylphenyl)ethane, bis(vinylbenzyl) ether, divinylbenzene, divinylnaphthalene, divinylbiphenyl, tert-butylstyrene, triallyl isocyanurate, triallyl cyanurate, trivinylcyclochexane, diallyl bisphenol A, styrene, butadiene, decadiene, octadiene, vinyl carbazole, and acrylate ester, or a combination thereof, and the unsaturated C═C double bond-containing crosslinking agent is 1 part by weight to 30 parts by weight with respect to 100 parts by weight of the unsaturated C═C double bond-containing polyphenylene ether resin.

7. The resin composition according to claim 1, wherein the resin composition further comprises any one of a curing accelerator, a polymerization inhibitor, an inorganic filler, a surfactant, a coloring agent, and a solvent, or a combination thereof.

8. An article made from the resin composition according to claim 1, comprising a prepreg, a resin film, a laminate, or a printed circuit board.

9. The article according to claim 8, wherein the article has at least one of the following properties:

a glass transition temperature as measured by reference to IPC-TM-650 2.4.24.4 of greater than or equal to 210° C.;

a dielectric constant at 10 GHz as measured by reference to JISC2565 of less than or equal to 3.24;

a dissipation factor at 10 GHz as measured by reference to JISC2565 of less than or equal to 0.0025;

a flame retardancy as measured by reference to UL94 rating of V0;

a percent thermal expansion at Z-axis as measured by reference to IPC-TM-650 2.4.24.5 of less than or equal to 2.0%;

a water absorption rate as measured by reference to IPC-TM-650 2.6.2.1 and IPC-TM-650 2.6.16.1 of less than or equal to 0.34%; and an interlayer bonding strength as measured by reference to IPC-TM-650 2.4.8 of greater than or equal to 3.0 lb/in.

* * * * *